United States Patent
Shizuki et al.

[11] Patent Number: 6,130,483
[45] Date of Patent: Oct. 10, 2000

[54] MMIC MODULE USING FLIP-CHIP MOUNTING

[75] Inventors: Yasushi Shizuki; Mitsuo Konno, both of Kanagawa, Japan

[73] Assignee: Kabushiki Kaisha Toshiba, Kawasaki, Japan

[21] Appl. No.: 09/035,298

[22] Filed: Mar. 5, 1998

[30] Foreign Application Priority Data

Mar. 5, 1997 [JP] Japan ............................... P09-050686

[51] Int. Cl.$^7$ ................................................ H01L 23/48
[52] U.S. Cl. .......................................... 257/778; 257/684
[58] Field of Search ............................................. 257/778

[56] References Cited

U.S. PATENT DOCUMENTS

| | | | |
|---|---|---|---|
| 5,045,820 | 9/1991 | Leicht et al. | 333/26 |
| 5,428,327 | 6/1995 | Bahl | 333/246 |
| 5,602,421 | 2/1997 | Li | 257/728 |
| 5,635,767 | 6/1997 | Wenzel et al. | 257/778 |
| 5,659,203 | 8/1997 | Call et al. | 257/778 |
| 5,757,074 | 5/1998 | Matloubian et al. | 257/702 |

FOREIGN PATENT DOCUMENTS 8-274248  10/1996  Japan .

OTHER PUBLICATIONS

Leah M. Felton, "High–Yield GaAs Flip–Chip MMICs Lead to Low Cost T/R Modules," 1994 IEEE MTT–S Digest, pp. 1707–1710.

Satoshi Yamaguchi, et al., "An Inverted Microstrip Line IC Structure for Ultra High–Speed Applications", Intenational Microwave Symposium TH4E–7, IEEE MTT–S Digest, Jun. 1995, pp. 1643–1646.

G. Baumann, et al., "Comparison of Flip Chip and Wire Bond Interconnections and the Technology Evaluation on 51 GHz Transceiver", Proceedings 26$^{th}$ European Microwave Conference, Sep. 1996, pp. 98–100.

T. Krem et al., "Advantages of Flip Chip Technology in Millimeter Wave Packing," IEEE MTT–S International Microwave Symposium Digest, vol. 1, Jun. 8, 1997, pp. 987–990.

S. Aoki et al., "A Flip Chip Bonding Technology Used Gold Pillars for Millimeter–Wave Applications," 1997 IEEE MTT–S nternational Microwave Symposium Digest, vol. 1, Jun. 8, 1997, pp. 731–734.

R. Jackson et al., "Modeling Millimeter–Wave IC Behavior for Flipped–Chip Mounting Schemes," IEEE Transactions on Microwave Theory and Techniques, vol. 45, No. 10, Oct. 1997, pp. 1919–1925.

*Primary Examiner*—Olik Chaudhuri
*Assistant Examiner*—Douglas A. Wille
*Attorney, Agent, or Firm*—Oblon, Spivak, McClelland, Maier & Neustadt, P.C.

[57] ABSTRACT

A semiconductor module has an MMIC chip flip-chip-mounted on a board. The MMIC chip has a ground line and bumps. The board has through holes and a ground electrode. These ground line, bumps, through holes, and ground electrode form a conductor continuum that defines a quasi-cavity. The module is designed so that the resonance frequency (fr) of the quasi-cavity is higher than the maximum operation frequency (fumax) of the MMIC chip. This prevents signal disturbance due to agreement between the resonance frequency (fr) and an operation frequency (fu) of the MMIC chip. If the MMIC chip is provided with bias circuits having MIM capacitors, the MIM capacitors are formed within the quasi-cavity. The quasi-cavity blocks magnetic fields generated by the MIM capacitors from leaking outside and badly affecting electronic parts arranged around the MMIC chip. The thickness of the MMIC chip is limited within a given range, to prevent coupling between a parasitic transmission line made of the substrate and ground line of the MMIC chip and a main transmission line on the MMIC chip, to thereby secure isolation between input and output signals to and from the MMIC chip.

24 Claims, 31 Drawing Sheets

MMIC MODULE USING FLIP-CHIP MOUNTING

BACKGROUND OF THE INVENTION

1. Field of the Invention

The present invention relates to a semiconductor device, and particularly, to a semiconductor module for processing superhigh-frequency signals that employ millimeter waves and microwaves as carriers.

2. Description of the Prior Art

Due to a shortage of frequencies to use for communications, superhigh-frequencies involving, for example, millimeter waves (30 GHz or over) are spotlighted.

FIG. 31 shows a module having an MMIC (monolithic microwave integrated circuit) chip for processing superhigh-frequency signals, according to a prior art. The MMIC chip 210 has, although not shown in the figure, active elements such as HEMTs (high electron mobility transistors) and concentrated or distributed constant circuits such as capacitors and resistors at the center of the principal surface of the MMIC chip 210. Around these elements, the MMIC chip 210 has bonding pads 230.

The MMIC chip 210 is mounted on a board 220, which has bonding pads 260. The bonding pads 230 and 260 are electrically connected to each other through bonding wires 240. Some of the bonding pads 260 are electrically connected to through holes 270 made through the board 220, and the through holes 270 are electrically connected to a ground electrode 280, which is substantially entirely formed over the back of the board 220.

A signal line 250 on one side of the board 220 guides external signals to a bonding wire 240 and a bonding pad 230 and then to the elements on the MMIC chip 210. The MIC chip 210 is square or rectangular in plan view. If the MMIC chip 210 is rectangular, the signal line 250 is usually connected to the center of a short side.

FIG. 32 shows examples of the elements formed in a central area of the principal surface of the MMIC chip 210. The elements may be HEMTs 201, capacitors 203, and distributed constant circuits 202a to 202d.

This prior art employs wire bonding to mount MMIC chip 210 on the board 220, and therefore, the chip and board must have the bonding pads 230 and 260. The bonding pads must be sufficiently large for connecting the bonding wires 240. In addition, the bonding pads on the chip and board must be separated from each other by a given distance to secure workability.

On the other hand, semiconductor modules for processing low-frequency signals frequently employ flip-chip mounting instead of the wire bonding. For the flip-chip mounting, metal bumps are formed in place of bonding pads on a chip, the chip is turned over, set on a board, and connected the bumps to signals lines on the board, to thereby electrically connect elements on the chip to the signal lines.

Compared with the wire bonding, the flip-chip mounting is advantageous in reducing a package area or volume. Since the flip-chip mounting uses no bonding wires, it causes no deterioration in signal transmission characteristics due to the inductor components of the bonding wires.

These advantages raise a need for applying the flip-chip mounting for superhigh-frequency MMIC modules.

It is not clear, however, if conventional flip-chip mounting structures for the low-frequency modules are applicable as they are to the superhigh-frequency modules. It is necessary, therefore, to provide novel design principles appropriate for the superhigh-frequency modules.

SUMMARY OF THE INVENTION

An object of the present invention is to provide a compact semiconductor module capable of stably processing specified superhigh-frequency signals.

In order to accomplish the object, a first aspect of the present invention provides a semiconductor module having an MMIC chip and a board on which the MMIC chip is flip-chip-mounted. The MMIC chip has a substrate and a transmission line formed on the substrate. The transmission line consists of a ground line made of a first conductor film, and a signal line made of a second conductor film. First bumps are formed along the periphery of the surface of the MMIC chip and are electrically connected to the ground line. The first bumps are used to flip-chip-mount the MMIC chip on the board. A ground electrode made of a third conductor film is formed on the back of the board. Through holes are made through the board, to electrically connect the first bumps to the ground electrode. The ground line, first bumps, through holes, and ground electrode form a conductor continuum that defines a quasi-cavity. According to the first aspect, the resonance frequency (fr) of the quasi-cavity is higher than the maximum operation frequency (fumax) of the MMIC chip.

Designing the resonance frequency of the quasi-cavity to be higher than the maximum operation frequency of the MMIC chip prevents signal disturbance due to coupling between the resonance frequency and the maximum operation frequency, to thereby stabilize the operation of the MMIC chip on superhigh-frequency signals.

A second aspect of the present invention provides a semiconductor module having an MMIC chip and a board on which the MMIC chip is flip-chip-mounted. The MMIC chip has a substrate, a transmission line formed on the substrate, and at least one bias circuit formed on the substrate. The transmission line consists of a ground line made of a first conductor film, and a signal line made of a second conductor film. Each bias circuit consists of an MIM (metal-insulator-metal) capacitor. First bumps are formed along the periphery of the surface of the MMIC chip and are electrically connected to the ground line. The first bumps are used to flip-chip-mount the MMIC chip on the board. A ground electrode made of a third conductor film is formed on the back of the board. Through holes are made through the board, to electrically connect the first bumps to the ground electrode. The ground line, first bumps, through holes, and ground electrode form a conductor continuum that defines a quasi-cavity. According to the second aspect, the MIM capacitors are formed within the quasi-cavity.

Forming the MIM capacitors inside the quasi-cavity shields magnetic fields produced by the MIM capacitors from leaking outside, so that electronic parts formed around the MMIC chip are free from the influence of the magnetic fields and operate stably.

A third aspect of the present invention provides a semiconductor module having an MMIC chip and a board on which the MMIC chip is flip-chip-mounted. The MMIC chip consists of a dielectric substrate, a main transmission line formed on the dielectric substrate, and active elements formed on the dielectric substrate. The main transmission line consists of a ground line made of a first conductor film, and a signal line made of a second conductor film. First bumps are formed along the periphery of the surface of the MMIC chip and are electrically connected to the ground line. The first bumps are used to flip-chip-mount the MMIC chip on the board. A ground electrode made of a third conductor film is formed on the back of the board. Through holes are made through the board, to electrically connect the first bumps to the ground electrode. The dielectric substrate and ground line form a parasitic transmission line. According to the third aspect, the cutoff frequency (fc) of the parasitic transmission line in a TE1 transmission mode is higher than the maximum operation frequency (fumax) of the MMIC chip.

Designing the cutoff frequency of the parasitic transmission line in the TE1 transmission mode to be higher than the maximum operation frequency of the MMIC chip prevents coupling between the main transmission line and the parasitic transmission line, to secure proper isolation between input and output signals to and from the MMIC chip.

DETAILED DESCRIPTION OF THE EMBODIMENTS

Figure 1A:
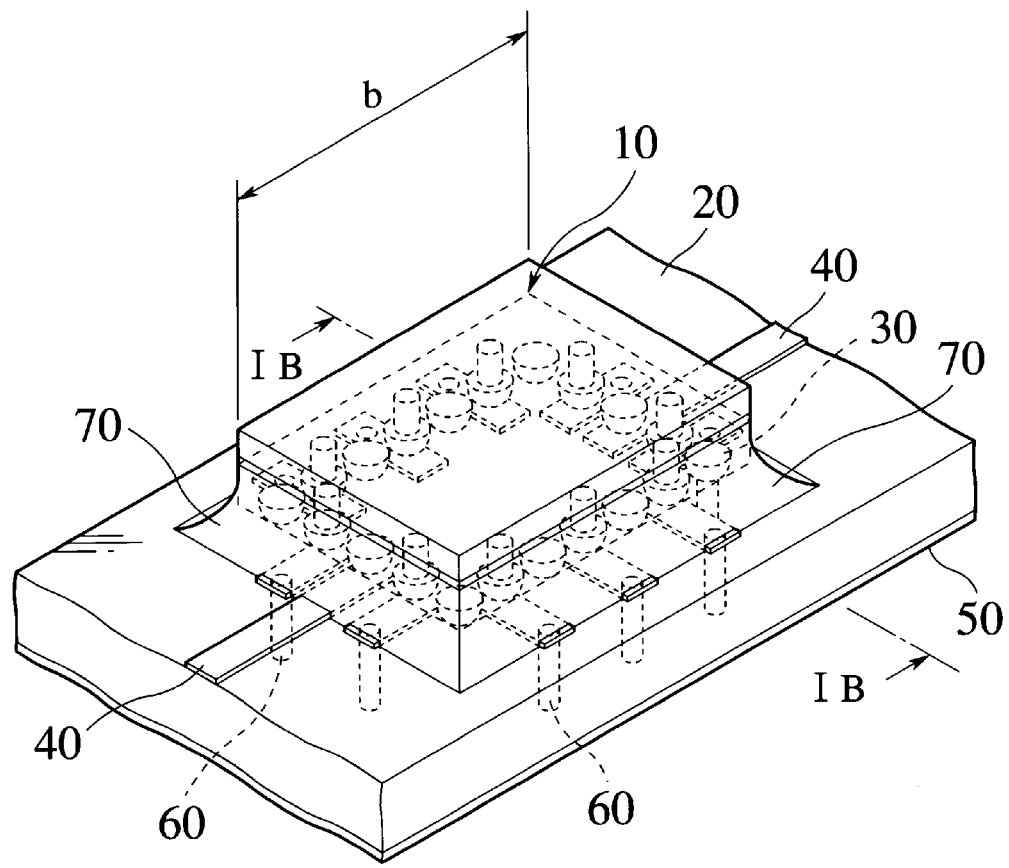
FIGS. 1A and 1B are perspective and sectional views showing an MMIC module based on the first aspect of the present invention.

FIG. 1A is a perspective view showing an MMIC module for processing superhigh-frequency signals according to the first aspect of the present invention. The MMIC module consists of an MMIC chip 10 and a board 20 on which the MMIC chip 10 is flip-chip-mounted.

The MMIC chip 10 has active elements and concentrated constant circuits in a central area of the principal surface thereof. Around these elements, metal bumps 30 are formed for use of flip-chip mounting. The MMIC chip 10 is turned over, and the bumps 30 are directly bonded to electrode pads 35 formed on the board 20, to thereby mount the MMIC chip 10 on the board 20. At this time, the bumps 30 form a space between the MMIC chip 10 and the board 20. This space is usually sealed with a resin seal 70. For the sake of clarity, the bumps 30 are scaled up through the figures.

Figure 31:
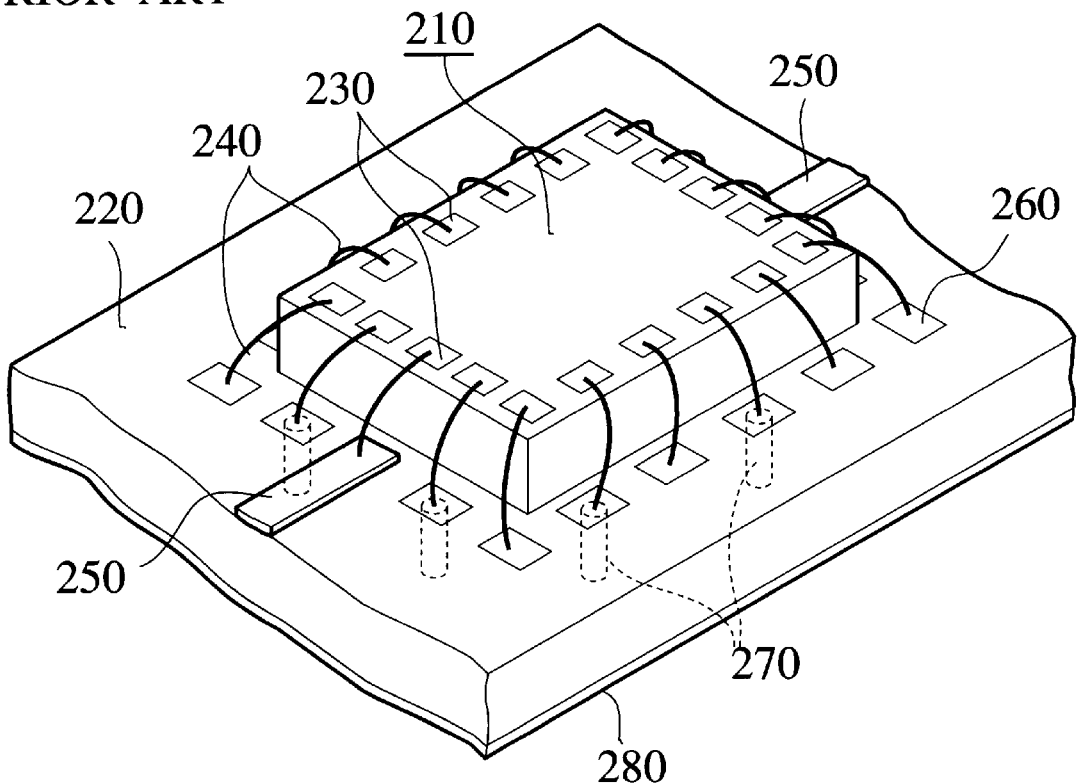
FIG. 31 is a perspective view showing an MMIC module according to a prior art.
Figure 32:
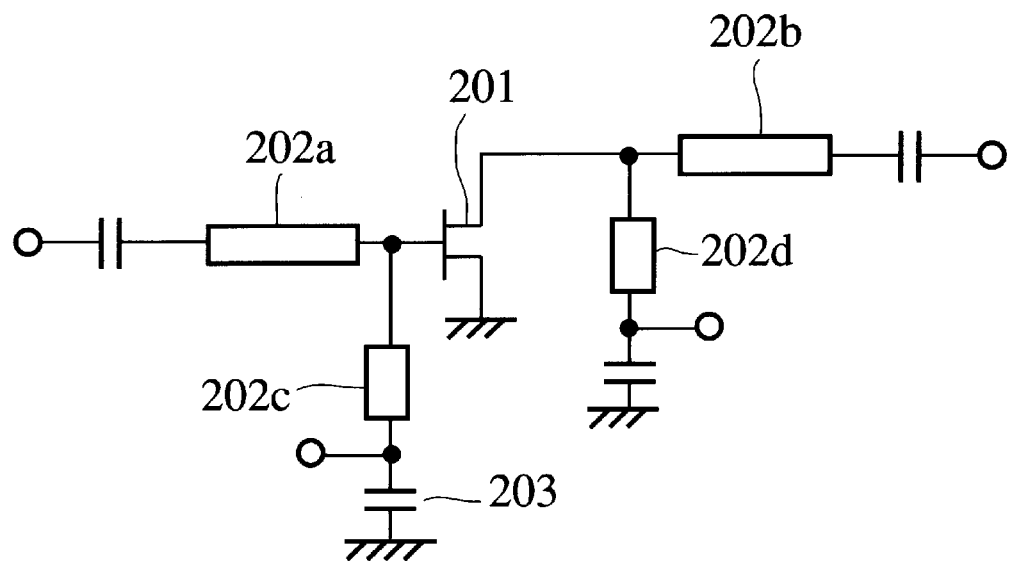
FIG. 32 is a circuit diagram showing the MMIC module of the prior art.

Other electrical connections of the MMIC module are substantially the same as those of the prior art of FIG. 31. A ground electrode 50 is formed nearly entirely on the back of the board 20. Some of the electrode pads 35 formed on the board 20 are connected to through holes 60, which are made through the board 20 and are electrically connected to the ground electrode 50.

A signal line 40 guides external input signals. The signal line 40 is connected to a bump 30 that is formed on a short side (this side of FIG. 1A) of the rectangular MMIC chip 10. This bump 30 is connected to the elements formed on the MMIC chip 10. Output signals from the MMIC chip 10 are sent through a bump 30 that is formed on the other short side of the MMIC chip 10, to the outside.

Generally, MMIC chips operating on high-frequency signals such as millimeter signals employ a microstrip transmission line. The microstrip transmission line consists of a planar ground line, a planar signal line, and a dielectric layer interposed between the ground and signal lines. The dielectric layer is usually the substrate of the MMIC chip, e.g., a gallium arsenic (GaAs) substrate. The ground line is formed on the back of the substrate, and the signal line is formed on the surface thereof.

To secure grounding for active elements formed on the MMIC chip, the substrate of 500 $\mu$m or thicker must be etched to about 50 $\mu$m, and via holes must be made through the substrate. These processes are troublesome. To avoid the trouble, some new proposals for transmission lines have been made.

A first is a coplanar waveguide transmission line consisting of a ground line and a signal line both formed on the surface of an MMIC chip. Active elements, etc., are also formed on the same surface where the ground line is formed, and therefore, there is no need of making via holes for grounding the elements.

A second is a thin-film microstrip transmission line consisting of a ground line formed on the surface of the substrate of an MMIC chip, a dielectric layer (single or multiple) formed on the ground line, and a signal line formed on the dielectric layer. This transmission line differs from the conventional microstrip transmission line in that the ground line, dielectric layer, and signal line are each formed of a thin film. Since there is no need of etching the substrate, this transmission line is easy to manufacture.

A third is an inverted thin-film microstrip transmission line consisting of a signal line formed on the surface of a GaAs substrate, a dielectric layer formed on the signal line, and a ground line formed on the dielectric layer. This structure is just an inversion of the thin-film microstrip transmission line.

The present inventors studied and analyzed the designing of superhigh-frequency-signal processing MMIC modules having MMIC chips provided with these three-types of transmission lines. Eventually, the present inventors clarified problems peculiar to processing superhigh-frequency signals and worked out design principles for the MMIC modules for processing such signals. The first to third aspects and the embodiments thereof mentioned below describe the design principles of the present inventors in detail.

I. First Aspect

[I-a. First problem in MMIC module designing: resonance frequency]

Figure 1B:
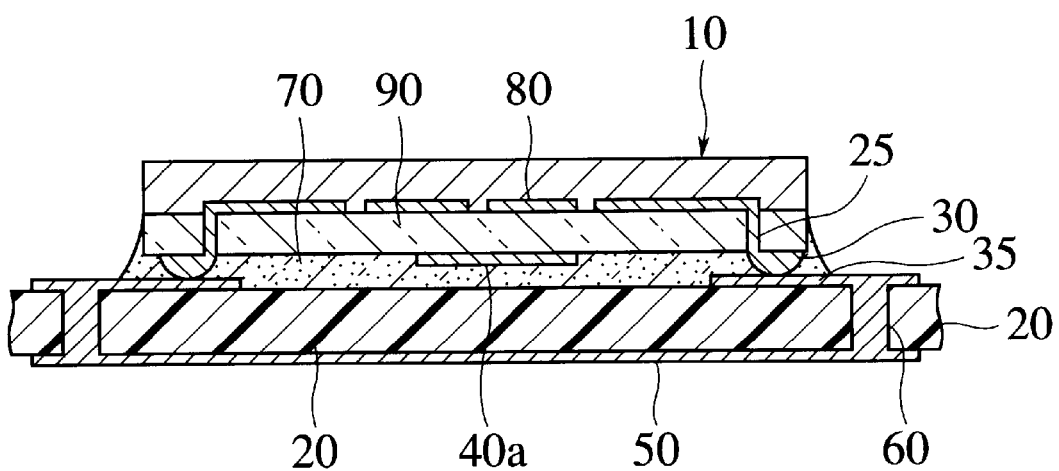

FIG. 1B is a sectional view taken along a line IB—IB of FIG. 1A, showing the MMIC chip 10 having a thin-film microstrip transmission line whose dielectric layer is made of resin.

The MMIC chip 10 has a GaAs substrate. A ground line 80 is substantially entirely formed on the surface of the GaAs substrate. The ground line 80 has openings serving as element areas where active elements and concentrated constant circuits are formed. These elements and circuits are not shown through the figures. A dielectric layer 90 covers the ground line 80 and element areas. A signal line 40a is formed on the dielectric layer 90.

The ground line 80 is electrically connected to through holes 25, which are electrically connected to the bumps 30 formed on the dielectric layer 90. The bumps 30 are electrically connected to the electrode pads 35 formed on the board 20. The electrode pads 35 are electrically connected to through holes 60 made through the board 20, and the through holes 60 are electrically connected to the ground electrode 50 formed on the back of the board 20.

Figure 2A:
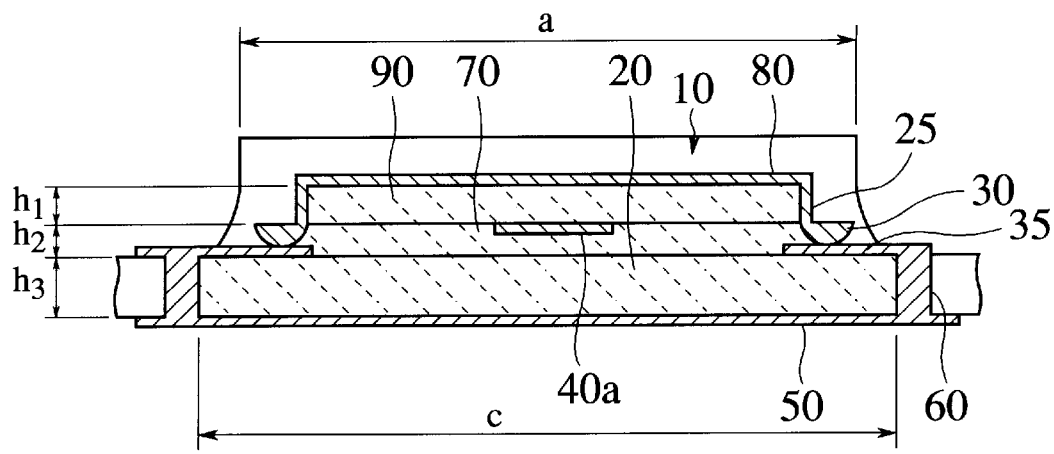
FIG. 2A is a sectional view showing a quasi-cavity formed in the MMIC module.

FIG. 2A is a sectional view corresponding to FIG. 1B. An area hatched with continuous lines represents conductor material of the MMIC module. The openings in the ground line 80 are considered to be negligibly small.

The ground line 80, through holes 25, bumps 30, electrode pads 35, through holes 60, and ground electrode 50 made a conductor continuum. The conductor continuum composes a quasi-cavity in the MMIC module. The present inventors also found that the quasi-cavity generated resonance frequency fr.

Through electromagnetic field analyses with values mentioned below, the present inventors specified the level of the resonance frequency fr. The values are 2.7 for the dielectric constant of the dielectric layer 90, 10 $\mu$m for the thickness h1 of the dielectric layer 90, 3.6 for the dielectric constant of the resin seal 70, 50 $\mu$m for the thickness h2 of the resin seal 70, 2.7 for the dielectric constant of the board 20, and 10 $\mu$m for the thickness h3 of the board 20. The length "a" of the short side of the MMIC chip 10 where the signal line 40 enters is 1.5 mm, the length "b" of the adjacent long side is 3.0 mm, and the width "c" of the board 20 is 1.5 mm.

These values are based on conventional MMIC modules formed by wire bonding.

Figure 2B:
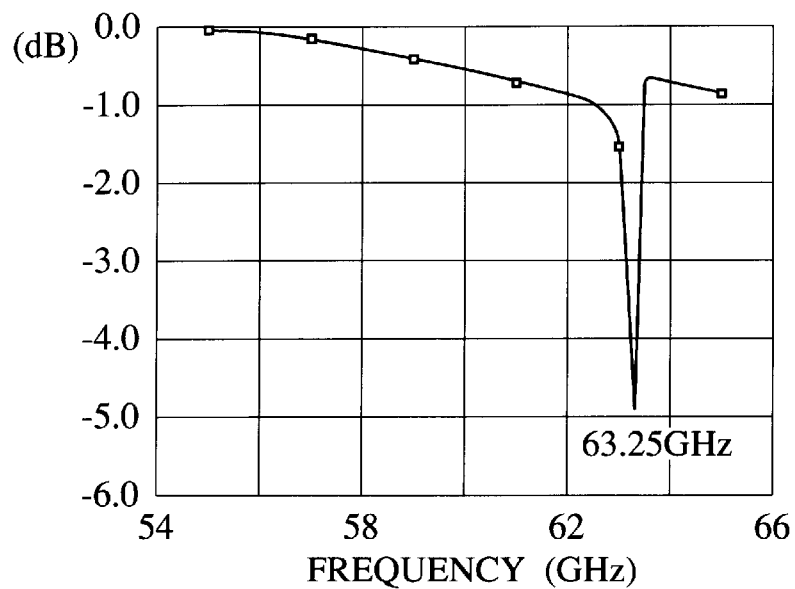
FIG. 2B is a graph showing a transmission characteristics curve with a resonance frequency produced by the quasi-cavity.

FIG. 2B shows a transmission characteristic curve obtained by the analyses. An abscissa represents frequencies in GHz and an ordinate represents transmission characteristics in dB. The curve has a dip at 63.25 GHz due to the resonance of the quasi-cavity.

The resonance frequency fr of a quasi-cavity of any MMIC module is close to the operation frequency fu of the MMIC module, and therefore, any MMIC module that is designed without paying attention to the resonance frequency fr will cause signal disturbance.

To stably operate on superhigh-frequency signals, MMIC modules must be designed so that the resonance frequency fr of a quasi-cavity in the MMIC modules does not interfere with the operation frequency fu of the MMIC modules.

The operation frequency of an MMIC module has an upper limit due to gain, etc., and therefore, the MMIC module is always operated in a frequency band below the maximum operation frequency fumax. Any MMIC module will never cause signal disturbance if it is designed so that the resonance frequency fr of a quasi-cavity in the MMIC module is above the maximum operation frequency fumax of the MMIC module.

[I-b. Cavity model for module designing]

Figure 2C:
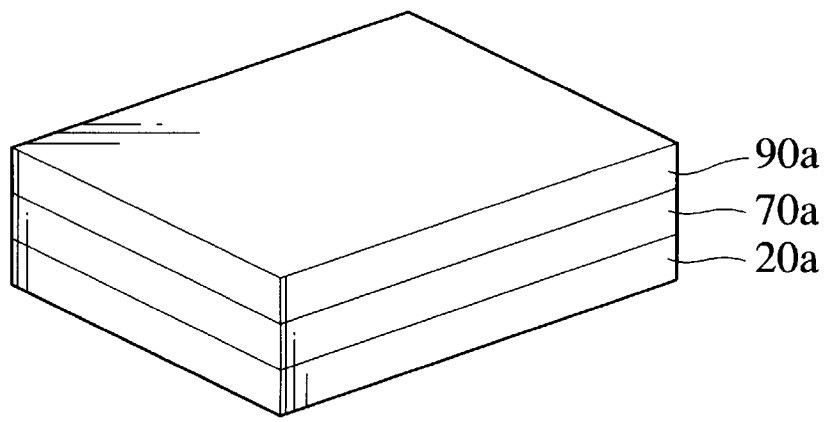
FIG. 2C is a perspective view showing a model of the quasi-cavity.

FIG. 2C is a model of the quasi-cavity mentioned in the MMIC module of FIG. 2A. This model is based on the present inventors' electromagnetic field analyses. The model consists of three dielectric layers 90a, 70a, and 20a having the same shape in plan view. The dielectric layer 90a has the same thickness h1 and dielectric constant e1 as the dielectric layer 90 (FIG. 2A), the dielectric layer 70a has the same thickness h2 and dielectric constant e2 as the resin seal 70, and the dielectric layer 20a has the same thickness h3 and dielectric constant e3 as the board 20.

If the expected lowest resonance frequency fr of a quasi-cavity in a given MMIC module is above the maximum operation frequency fumax thereof, a usual operation frequency fu of the MMIC module will be below the resonance frequency fr. The resonance frequency fr of the model of FIG. 2C is calculable from a general expression for the resonance wavelength of a cavity resonator. The lowest resonance frequency is equal to a lowest-order resonance mode, and therefore, the general expression is modified as follows:

$$\frac{1}{(2a)^2} + \frac{1}{(2b)^2} = \frac{ea}{(\lambda r)^2} \quad (1)$$

where "$\lambda r$" is a lowest-order resonance wavelength, "ea" is the equivalent dielectric constant of the model, "a" is the length of the short side of the model, and "b" is the length of the long side thereof. These lengths a and b correspond to those of the MMIC chip 10.

The equivalent dielectric constant ea of the model is as follows:

$$\frac{h1 + h2 + h3}{ea} = \frac{h1}{e1} + \frac{h2}{e2} + \frac{h3}{e3} \quad (2)$$

Accordingly, ea=3.09. Then, the expression (1) provides the lowest-order resonance wavelength $\lambda r$, which is converted into a resonance frequency fr=62.5 GHz. This value is within a 1% range around the value of FIG. 2B that is based on the electromagnetic field analyses. This confirms that the model of FIG. 2C is reasonable to use to design MMIC modules.

A quasi-cavity in an MMIC module consisting of an MMIC chip flip-chip-mounted on a board is defined as a space enclosed with a conductor continuum involving a ground line on the MMIC chip, outermost bumps on the MMIC chip, through holes on the board, and a ground electrode on the board. The outermost bumps are formed along the periphery of the MMIC chip.

[I-c. Consideration of bump pitches on cavity model]

The ground line 80, through holes 25, bumps 30, electrode pads 35, through holes 60, and ground electrode 50 of FIG. 2A form the conductor continuum that defines the quasi-cavity modeled in FIG. 2C. The ground line 80 is substantially entirely formed on the substrate of the MMIC chip 10. The element openings formed on the ground line 80 are negligibly small in calculating the resonance frequency fr of the quasi-cavity. A pitch between the adjacent bumps 30 is approximated to be zero. The concentration of the through holes and electrode pads is dependent on the pitches of the bumps 30 electrically connected to the ground line 80.

In practice, however, the bumps 30 are separated from one another, and the pitches thereof are not zero. In addition, only some of the bumps are connected to the ground line 80. Accordingly, for the safety of designing, it is necessary to consider the pitches of the bumps that are electrically connected to the ground line 80.

Figure 3A:
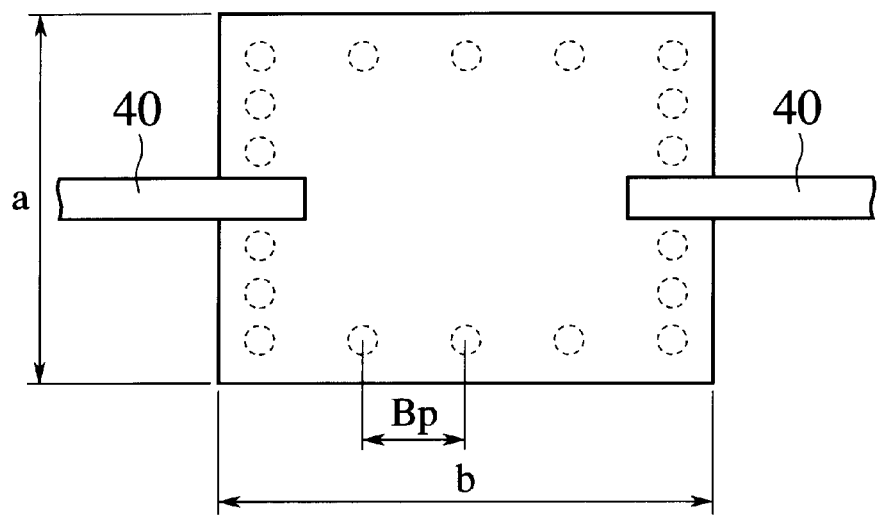
FIG. 3A is a plan view showing an arrangement of bumps formed on an MMIC chip of the MMIC module.

FIG. 3A is a plan view showing the MMIC chip 10 of FIG. 1A. Dotted circles represent the bumps 30. The MMIC chip 10 has the short side length "a" and long side length "b." The bumps formed along the long side have pitches of Bp.

The short side is connected to the signal line 40, and therefore, the locations of the bumps on the short side are dependent on the signal line 40. Namely, the number and locations of the bumps on the short side are restricted. On the other hand, the number, locations, and pitches Bp of the bumps on the long side vary depending on the elements formed on the MMIC chip 10.

Figure 3B:
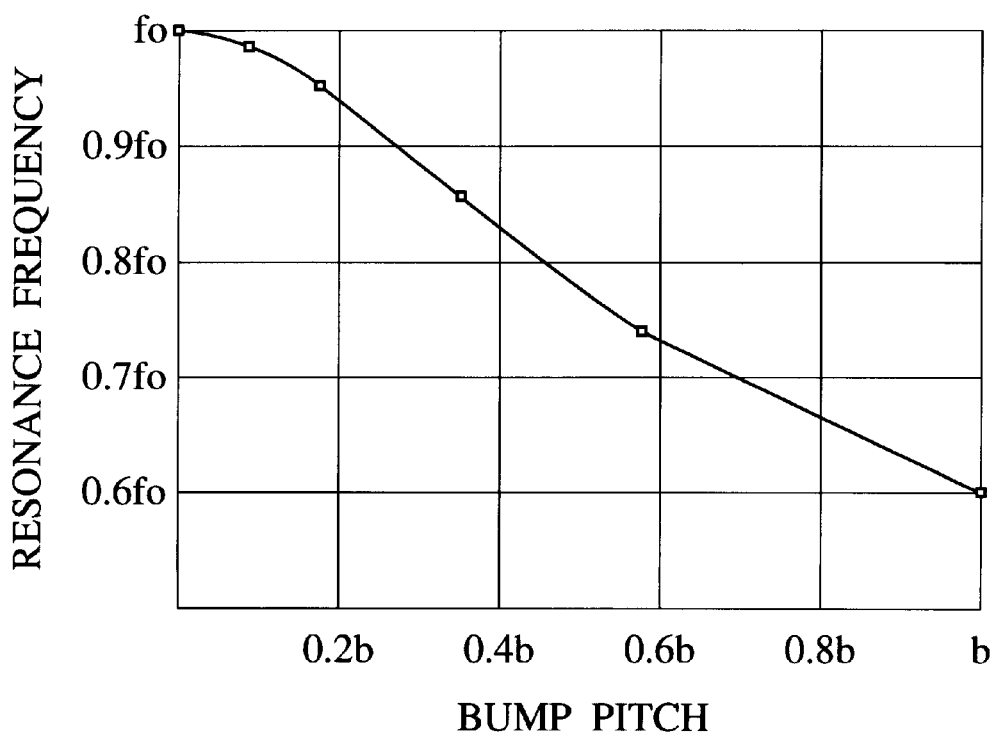
FIG. 3B is a graph showing the relationship between resonance frequencies and bump pitches.

FIG. 3B is a graph showing a result of simulations on the relationship between the pitches Bp of bumps on the long side of an MMIC chip and resonance frequencies. The long-side-to-short-side length ratio b:a in the simulations was 4:3.

An ordinate represents the resonance frequencies fr normalized with a resonance frequency f0 for a bump pitch of zero. An abscissa represents the bump pitches Bp normalized with the long-side length b. The graph shows that the resonance frequencies fr drop as the bump pitches Bp widen.

In actual MMIC chips, a bump pitch is always smaller than a long-side length. Accordingly, an actual resonance frequency fr is always larger than a resonance frequency fr(Bp=b) that is obtained when a bump pitch is equal to a long-side length. When the resonance frequency fr(Bp=b) is below the maximum operation frequency fumax, some troubles are caused by the resonance. If any MMIC module is designed so that the resonance frequency fr(Bp=b) thereof is above the maximum operation frequency fumax of the MMIC module, signal disturbance due to the resonance frequency never occurs.

If the bump pitch Bp is equal to the long-side length b, the short-side length a in the expression (1) is infinite (a=∞), and the resonance wavelength $\lambda r$ is as follows:

$$\lambda r = 2b\sqrt{ea} \quad (3)$$

Accordingly, the resonance frequency fr(Bp=b) is as follows:

$$fr(Bp = b) = \frac{c}{2b\sqrt{ea}} \quad (4)$$

where "c" is the velocity of light.

To surely prevent signal disturbance due to the resonance frequency of a quasi-cavity, MMIC modules must be designed to satisfy the following condition:

$$fumax < \frac{c}{2b\sqrt{ea}} \quad (5)$$

This can be written as follows:

$$b < \frac{c}{2 fumax \sqrt{ea}} \quad (5)'$$

It is understood from the expression (4) that the lowest resonance frequency of a quasi-cavity formed with an MMIC chip having a short-side length of a and a long-side length of b is $$c/2b\sqrt{ea}$$

or above.

If there are more than 3 bumps in the long-side of the MMIC chip, the bump pitch is less than b/2, therefore, the resonance frequency fr of a quasi-cavity is written as follows:

$$fr \frac{c}{2b\sqrt{ea}} > \quad (6)$$

Signals in an MMIC chip advance along the long sides thereof. Usually, the signals are amplificated by the MMIC. If the signals are fed back, oscillations will occur. To avoid coupling between a transmission line running along the long sides and a quasi-cavity, the minimum cutoff frequency of a quasi-waveguide along the long sides composed of the quasi-cavity must be higher than the maximum operation frequency of the MMIC chip. Namely, the following condition must be satisfied:

$$fumax < \frac{c}{2a\sqrt{ea}} \quad (7)$$

According to the expressions (6), (7), when there are more than 3 bumps in the long-side of the MMIC chip, MMIC module must be designed to satisfy the following condition:

$$\frac{c}{2b\sqrt{ea}} < fumax < \frac{c}{2a\sqrt{ea}} \quad (7)'$$

The expressions mentioned above are based on the assumption that a ground line (80 in FIG. 2A) is entirely formed on a GaAs substrate of an MMIC chip and element openings formed on the ground line are negligibly small.

The element openings are ignorable in the above expressions if the diameter of each opening is $$\lambda u / 4\sqrt{\varepsilon r}$$

or below where $$\lambda u / \sqrt{\varepsilon r}$$

is a signal wavelength in an MMIC chip whose maximum operation frequency is fumax. Namely, any opening formed on the ground line of an MMIC chip is ignorable if the diameter "0r" of the opening satisfies the expression (8) mentioned below. In MMIC chips for processing superhigh-frequency signals, the length $$\lambda u / 4\sqrt{\varepsilon r}$$

is naturally shorter than the short-side length a of the MMIC chips, and therefore, the expression (8) is established.

$$Or < \frac{\lambda u}{4\sqrt{\varepsilon r}} < a \quad (8)$$

Generally, the diameter of an active element or a concentrated constant circuit formed on an MMIC chip is sufficiently small so that an opening formed for the element or circuit on a ground line satisfies the expression (8).

MMIC modules employing the design principles of the present invention will be explained in detail.

[Embodiment 1.1]

Figure 4A:
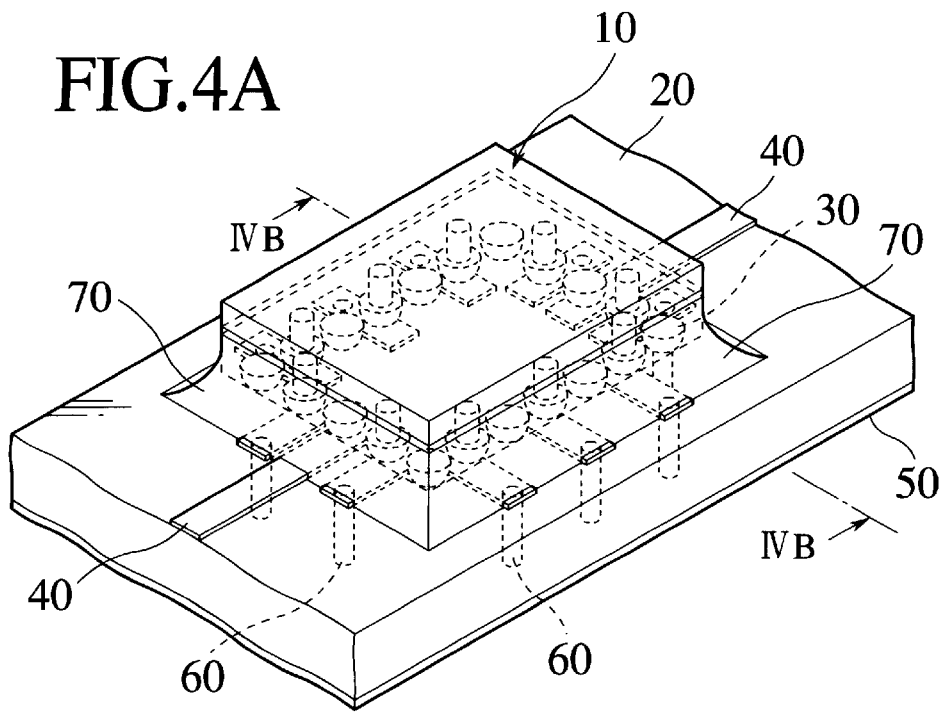
FIGS. 4A and 4B are perspective and sectional views showing an MMIC module according to embodiment 1.1 based on the first aspect.
Figure 4B:
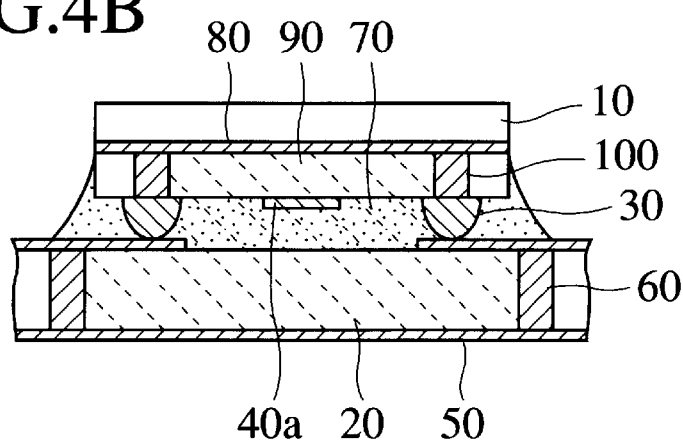

Embodiment 1.1 provides a most basic MMIC module based on the design principles of the present invention. FIG. 4A is a perspective view showing the MMIC module for processing superhigh-frequency signals, and FIG. 4B is a sectional view taken along a line IVB—IVB of FIG. 4A.

The structure of the MMIC module is fundamentally the same as that of FIG. 1A. Namely, the module consists of an MMIC chip 10 flip-chip-mounted on a board 20. The MMIC chip 10 is made of a GaAs substrate whose principal surface is substantially entirely covered with a ground line 80. The ground line 80 has openings where active elements such as HEMTs and various concentrated constant circuits are formed. Each of these openings satisfies the expression (8).

A dielectric layer 90 is formed on the ground line 80, and a signal line 40a is formed on the dielectric layer 90. The ground line 80, dielectric layer 90, and signal line 40a form a thin-film microstrip transmission line. The dielectric layer 90 is made of resin such as polyimide and BCB (benzocyclobutene).

The ground line 80 is electrically connected to via holes 100 made through the dielectric layer 90, and the via holes 100 are electrically connected to bumps 30. The bumps 30 are electrically connected to electrode pads formed on the board 20. The electrode pads are electrically connected to through holes 60 made through the board 20, and the through holes 60 are electrically connected to a ground electrode 50 formed on the back of the board 20. The bumps 30 form a space between the MMIC chip 10 and the board 20, and the space and bumps 30 are sealed with a resin seal 70. The resin seal 70 reinforces the bonding strength of the bumps 30 against thermal stress.

The bumps 30 are made of, for example, gold or solder. The board 20 may be a resin substrate made of Teflon, BCB, or polyimide, or a ceramic substrate made of alumina, etc.

Circuits for supplying power to the MMIC chip and elements such as transistors formed on the principal surface of the substrate are not shown in FIG. 4A.

In FIG. 4B, the ground line 80, through holes 100, bumps 30, electrode pads on the board 20, through holes 60, and ground electrode 50 form a conductor continuum that defines a quasi-cavity.

Figure 4C:
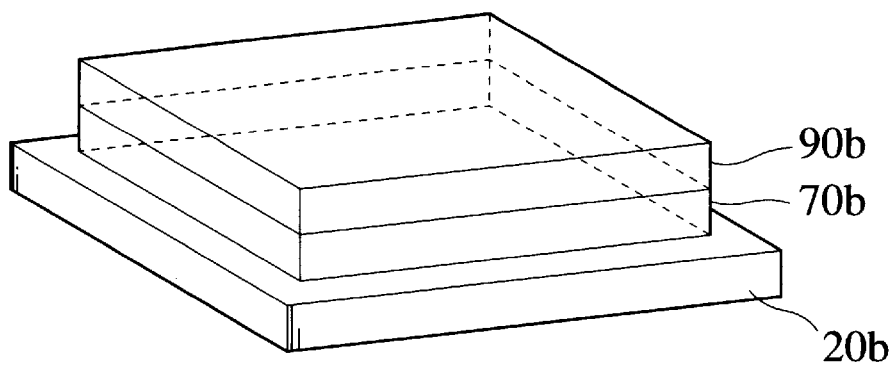
FIG. 4C is a perspective view showing a model of a quasi-cavity in the MMIC module of the embodiment 1.1.

FIG. 4C is a model of the quasi-cavity. The model consists of layers 90b, 70b, and 20b corresponding to the dielectric layer 90, seal resin 70, and board 20, respectively. If the quasi-cavity is completely covered with a conductor, it provides a resonance frequency fr. Accordingly, the dimensions and materials of the MMIC module of FIG. 4A must be designed so that the resonance frequency fr is above the maximum operation frequency fumax of the MMIC chip 10, i.e., the maximum frequency of signals supplied to the MMIC chip 10 through a signal line 40.

[Embodiment 1.2]

Figure 5A:
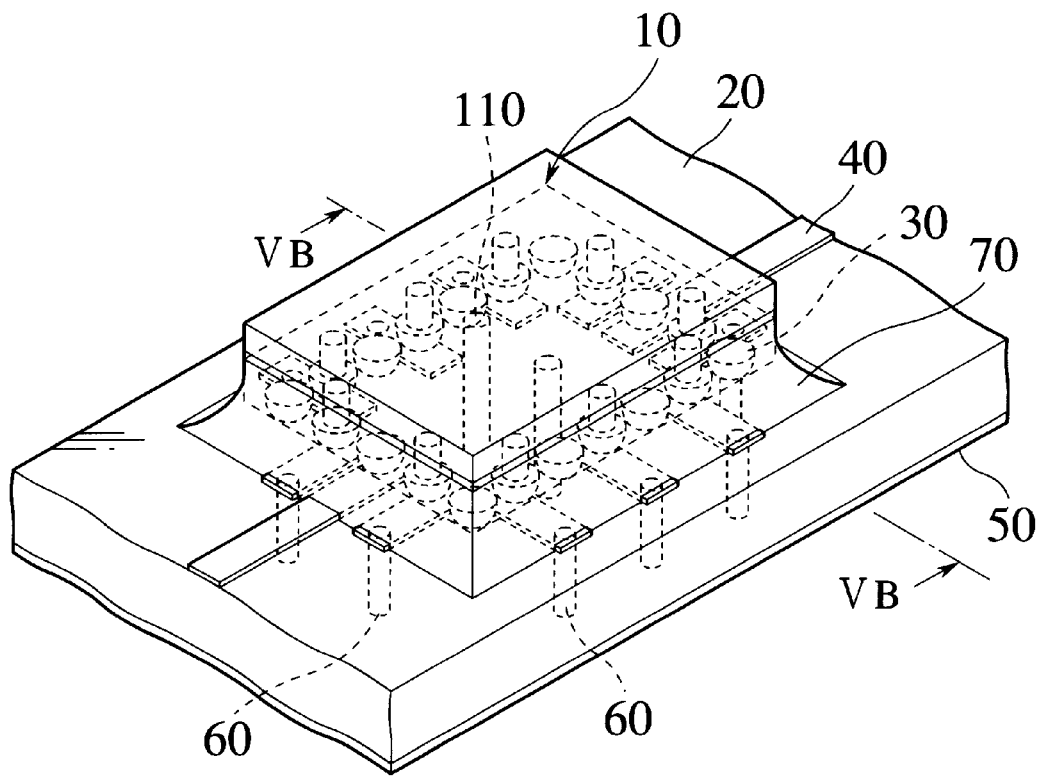
FIGS. 5A and 5B are perspective and sectional views showing an MMIC module according to embodiment 1.2 based on the first aspect.
Figure 5B:
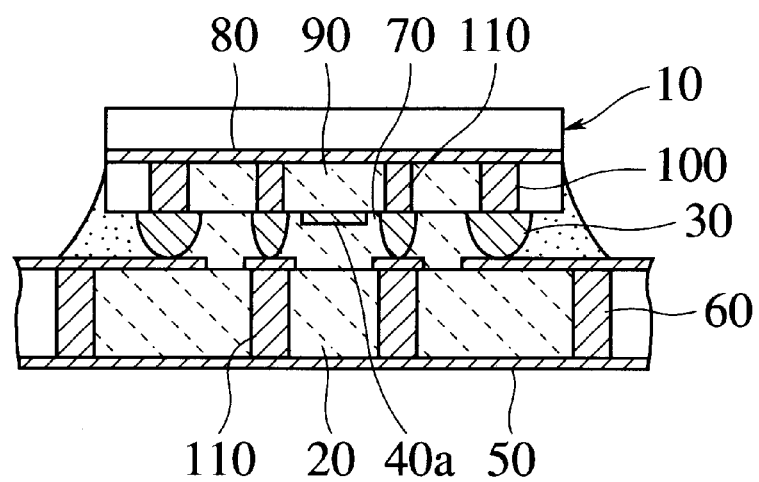

FIG. 5A is a perspective view showing an MMIC module consisting of an MMIC chip 10 flip-chip-mounted on a board 20, according to embodiment 1.2 of the present invention. FIG. 5B is a sectional view taken along a line VB—VB of FIG. 5A.

The structure of this embodiment is fundamentally the same as that of the embodiment 1.1. What is different from the embodiment 1.1 is that the embodiment 1.2 forms vias 110 in a central area of the MMIC chip 10. The vias 110 are connected to a ground line 80. Each of the vias 110 is made of a through hole made through a dielectric layer 90, a bump, and a through hole made through the board 20.

The vias 110 reduce the volume of a quasi-cavity defined with a conductor continuum in the MMIC module. Even if the designed resonance frequency fr of the quasi-cavity is below the maximum operation frequency fumax of the MMIC chip 10, the central vias 110 increase the actual resonance frequency fr of the quasi-cavity above the maximum operation frequency fumax, to thereby stabilize the operation of the MMIC chip 10.

[Embodiment 1.3]

Figure 6A:
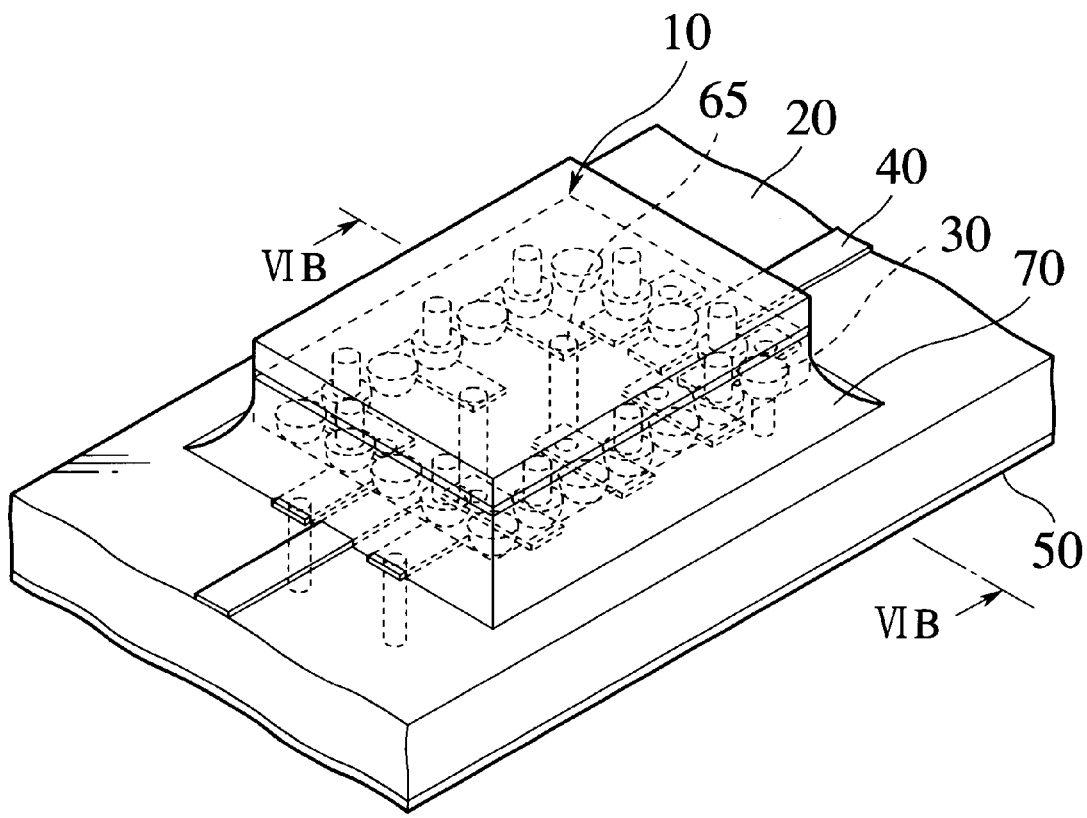
FIGS. 6A and 6B are perspective and sectional views showing an MMIC module according to embodiment 1.3 based on the first aspect.
Figure 6B:
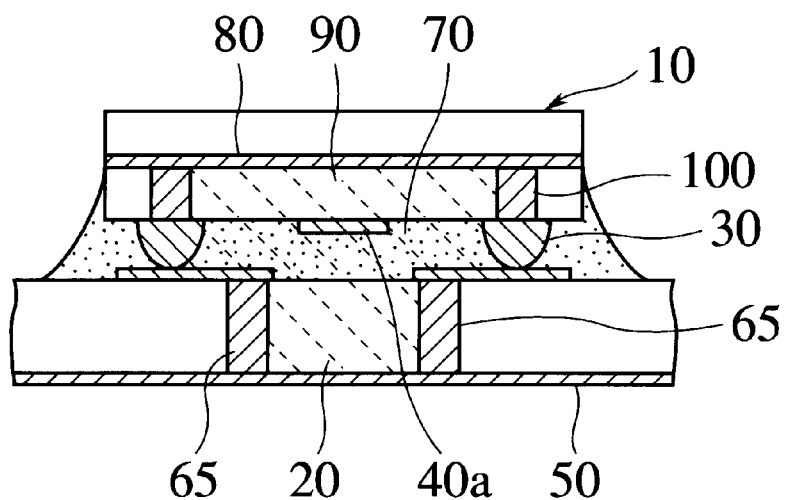

FIG. 6A is a perspective view showing an MMIC module consisting of an MMIC chip 10 flip-chip-mounted on a board 20, according to embodiment 1.3 of the present invention. FIG. 6B is a sectional view taken along a line VIB—VIB of FIG. 6A.

The structure of the embodiment 1.3 is fundamentally the same as that of embodiment 1.1. What is different from the embodiment 1.1 is that the embodiment 1.3 makes through holes 65 through the board 20 instead of the through holes 60 of the embodiment 1.1. The through holes 65 are closer to the center of MMIC chip 10, to narrow the width of a quasi-cavity defined in the MMIC module. More precisely, the through holes 65 reduce the value "a" in the expression (1) to calculate a wavelength corresponding to the resonance frequency fr of the quasi-cavity. This results in increasing the resonance frequency fr.

Compared with the embodiment 1.1, the embodiment 1.3 is easier to increase the resonance frequency fr of the quasi-cavity higher than the maximum operation frequency fumax of the MMIC chip 10, i.e., the maximum frequency of signals supplied to the MMIC chip 10.

[Embodiment 1.4]

Figure 7A:
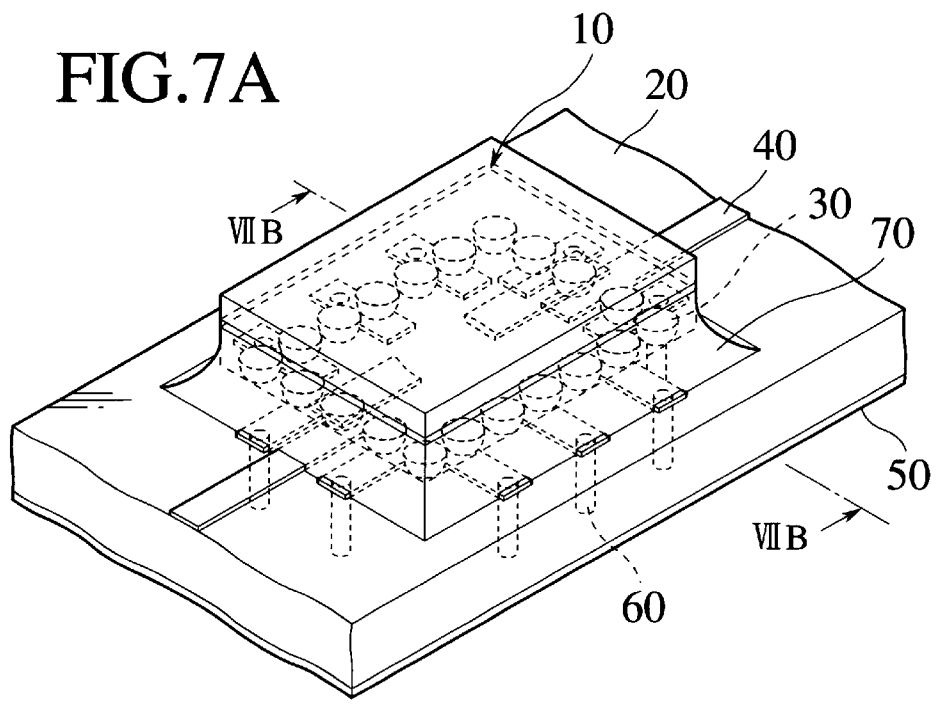
FIGS. 7A and 7B are perspective and sectional views showing an MMIC module according to embodiment 1.4 based on the first aspect.
Figure 7B:
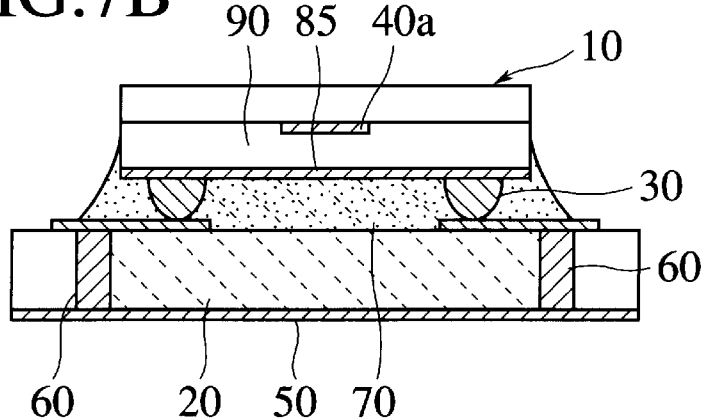

FIG. 7A is a perspective view showing an MMIC module consisting of an MMIC chip 10 flip-chip-mounted on a board 20, according to embodiment 1.4 of the present invention. FIG. 7B is a sectional view taken along a line VIIB—VIIB of FIG. 7A.

Unlike the embodiments 1.1 to 1.3, the embodiment 1.4 employs an inverted thin-film microstrip transmission line. The other parts of the embodiment are the same as those of the embodiment 1.1.

The inverted thin-film microstrip transmission line consists of a signal line 40a formed on the surface of a GaAs substrate of the MMIC chip 10 where transistors and concentrated constant circuits are formed, a dielectric layer 90 formed on the signal line 40a and other elements, and a ground line 85 formed on the dielectric layer 90.

In FIG. 7B, the ground line 85, bumps 30, electrode pads on the board 20, through holes 60 made through the board 20, and a ground electrode 50 formed on the back of the board 20 form a conductor continuum to define a quasi-cavity that resonates.

Figure 7C:
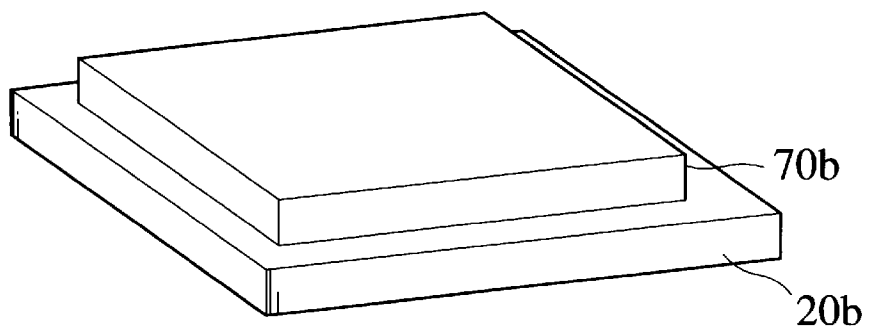
FIG. 7C is a perspective view showing a model of a quasi-cavity in the MMIC module of the embodiment 1.4.

FIG. 7C shows a model of the quasi-cavity. The model consists of layers 70b and 20b corresponding to a resin seal 70 and the board 20, respectively. If the quasi-cavity is entirely covered with a conductor, it provides a resonance frequency fr. The dimensions and materials of the MMIC module must be designed so that the resonance frequency fr is above the maximum frequency of signals supplied to the MMIC chip 10 through a signal line 40.

[Embodiment 1.5]

Figure 8A:
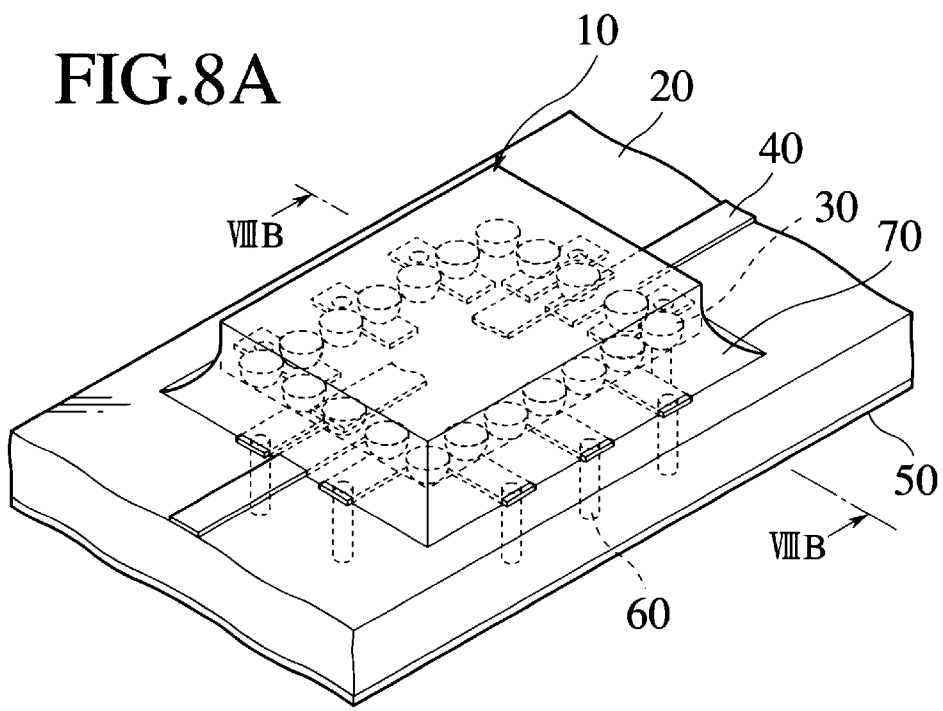
FIGS. 8A and 8B are perspective and sectional views showing an MMIC module according to embodiment 1.5 based on the first aspect.
Figure 8B:
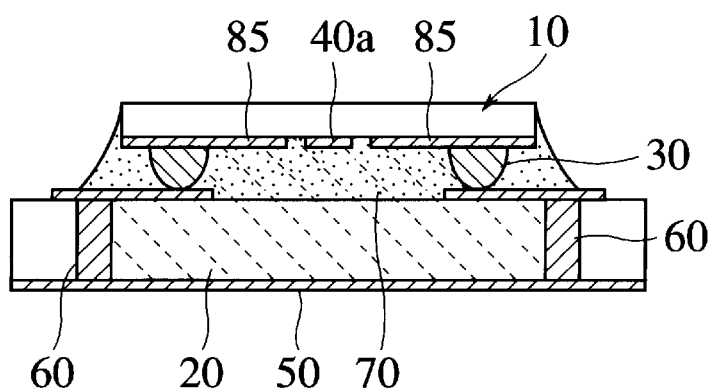

FIG. 8A is a perspective view showing an MMIC module consisting of an MMIC chip 10 flip-chip-mounted on a board 20, according to embodiment 1.5 of the present invention. FIG. 8B is a sectional view taken along a line VIIIB—VIIIB of FIG. 8A.

Unlike the embodiments 1.1 to 1.4, the embodiment 1.5 employs a coplanar waveguide transmission line. The other parts of the embodiment are the same as those of the embodiment 1.1.

The coplanar waveguide transmission line consists of a signal line 40a and a ground line 85 both formed on the surface of a GaAs substrate of the MMIC chip 10. The ground line 85 is arranged on each side of the signal line 40a with a gap between them.

The ground line 85, bumps 30, electrode pads on the board 20, through holes 60 made through the board 20, and a ground electrode 50 on the back of the board 20 form a conductor continuum to define a quasi-cavity that resonates.

Figure 8C:
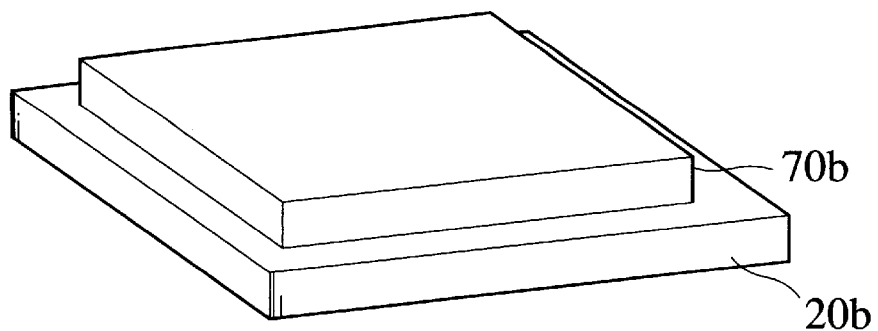
FIG. 8C is a perspective view showing a model of a quasi-cavity in the MMIC module of the embodiment 1.5.

FIG. 8C shows a model of the quasi-cavity. The model consists of layers 70b and 20b corresponding to a resin seal 70 the board 20, respectively. If the quasi-cavity is entirely covered with a conductor, it provides a resonance frequency fr. Accordingly, the dimensions and materials of the MMIC module must be designed to make the resonance frequency fr higher than the maximum operation frequency fumax of the MMIC chip 10.

[Embodiment 1.6]

Figure 9A:
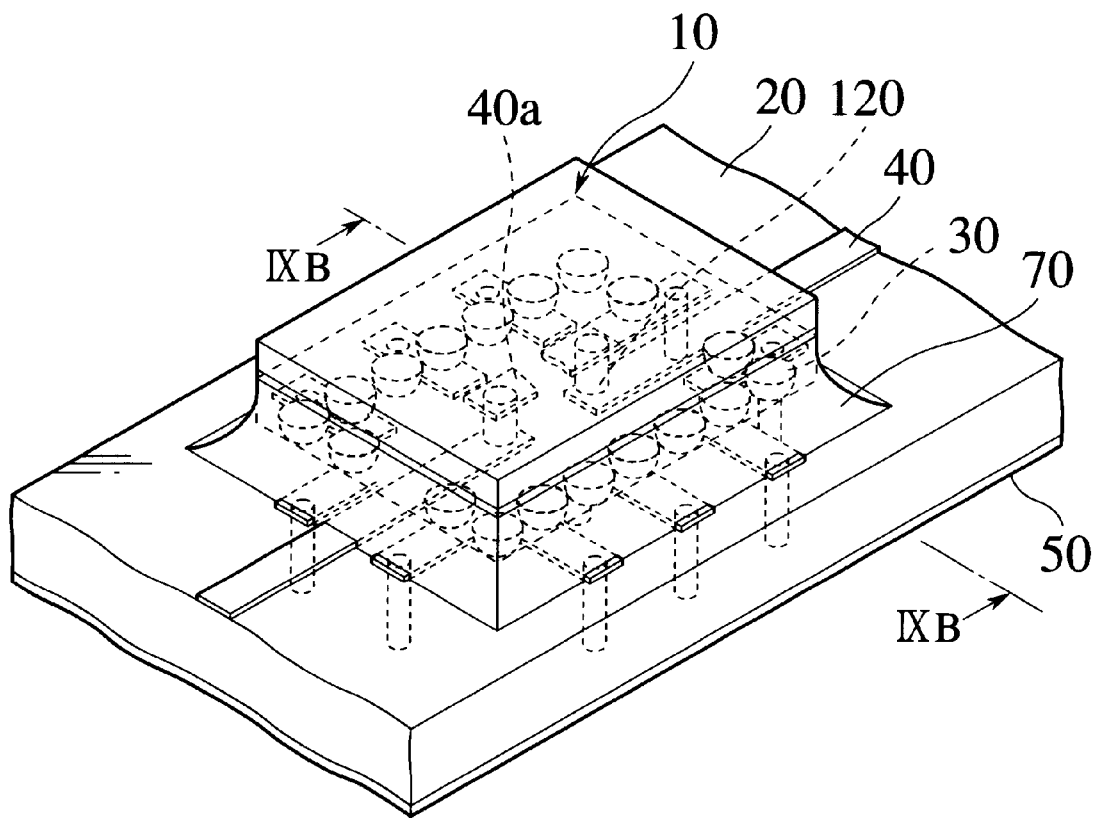
FIGS. 9A and 9B are perspective and sectional views showing an MMIC module according to embodiment 1.6 based on the first aspect.
Figure 9B:
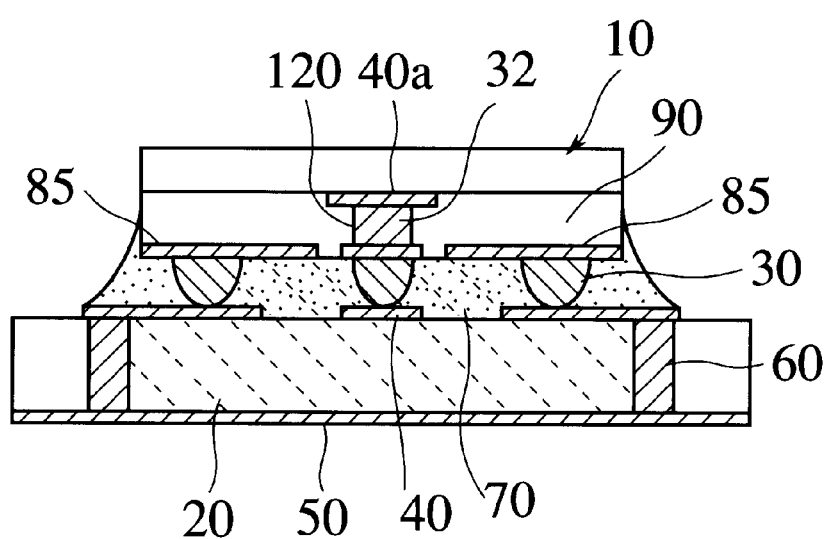

FIG. 9A is a perspective view showing an MMIC module consisting of an MMIC chip 10 flip-chip-mounted on a board 20, according to embodiment 1.6 of the present invention. FIG. 9B is a sectional view taken along a line IXB—IXB of FIG. 9A.

The structure of the embodiment 1.6 is fundamentally the same as that of the embodiment 1.4. The embodiment 1.6 employs an inverted thin-film microstrip transmission line. What is different from the embodiment 1.4 is that the embodiment 1.6 connects a signal line 40a of the MMIC chip 10 to a signal line 40 of the board 20 at the center of the MMIC chip 10. The signal line 40a is electrically connected to the signal line 40 through a through hole 120 and a bump 32 as shown in FIG. 9B.

This embodiment extends the signal line 40a up to the central part of the MMIC chip 10. When a quasi-cavity defined in the MMIC module resonates, the center of the quasi-cavity resonates only a little because a magnetic field at there is too weak to couple with the signal line 40a.

[Embodiment 1.7]

Figure 10A:
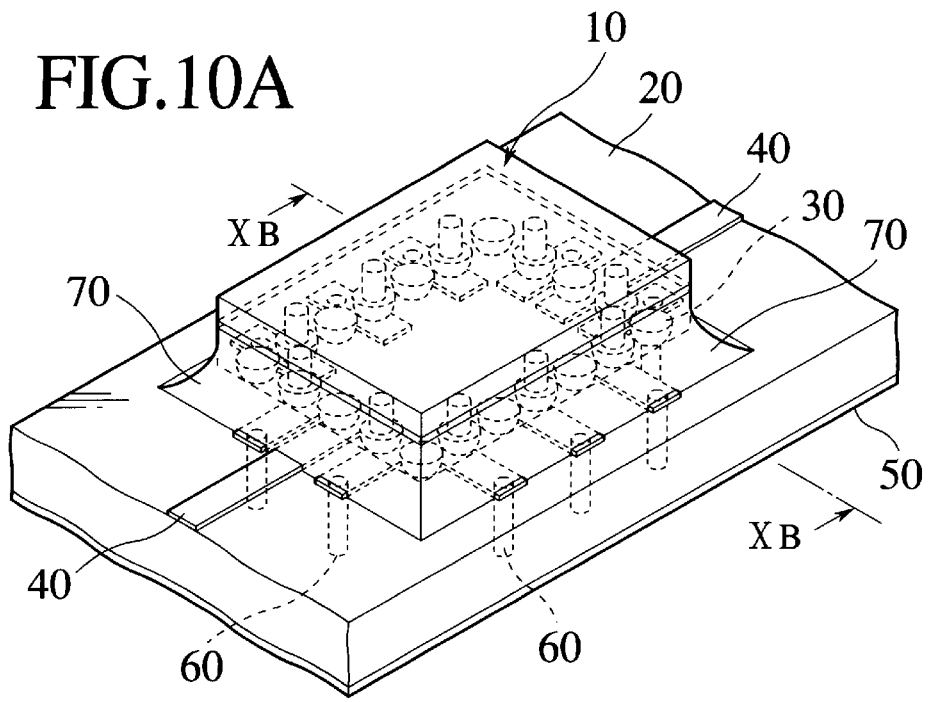
FIGS. 10A and 10B are perspective and sectional views showing an MMIC module according to embodiment 1.7 based on the first aspect.
Figure 10B:
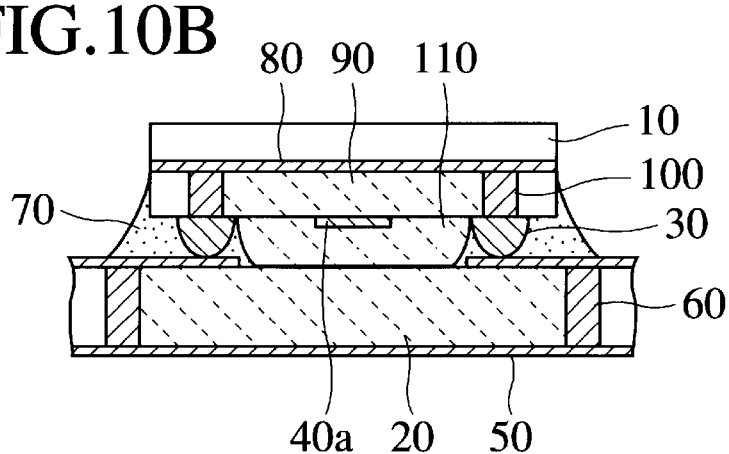
Figure 10C:
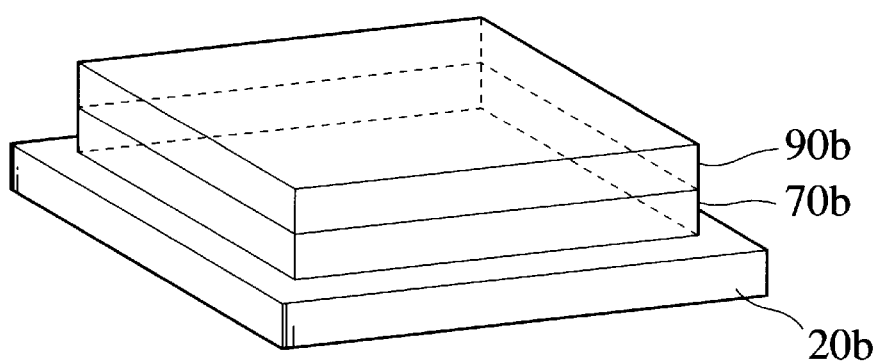
FIG. 10C is a perspective view showing a model of a quasi-cavity in the MMIC module of the embodiment 1.7.

FIG. 10A is a perspective view showing an MMIC module consisting of an MMIC chip 10 flip-chip-mounted on a board 20, according to embodiment 1.7 of the present invention. FIG. 10B is a sectional view taken along a line XB—XB of FIG. 10A.

The structure of the embodiment 1.7 is fundamentally the same as that of the embodiment 1.1. What is different from the embodiment 1.1 is that the embodiment 1.7 forms a resin seal 70 only along the periphery of the MMIC chip 10, to form an air space 110 between the MMIC chip 10 and the board 20.

The ground line 80, through holes 100, and bumps 30 of the MMIC chip 10 and the electrode pads, through holes 60, and ground electrode 50 of the board 20 form a conductor continuum that defines a quasi-cavity.

The quasi-cavity includes the air space 110. The dielectric constant of air is 1, which is smaller than that of the resin seal 70. This results in decreasing the equivalent dielectric constant "ea" of the quasi-cavity in the expression (2), thereby increasing the resonance frequency fr of the quasi-cavity as is apparent from the expression (4).

Compared with the embodiment 1.1, the embodiment 1.7 is easier to make the resonance frequency fr of the quasi-cavity higher than the maximum operation frequency fumax of the MMIC chip 10, i.e., the maximum frequency of signals supplied to the MMIC chip 10. The resin seal 70 around the bumps 30 sufficiently maintains the bonding strength of the bumps 30 against thermal stress.

[Embodiment 1.8]

Figure 11A:
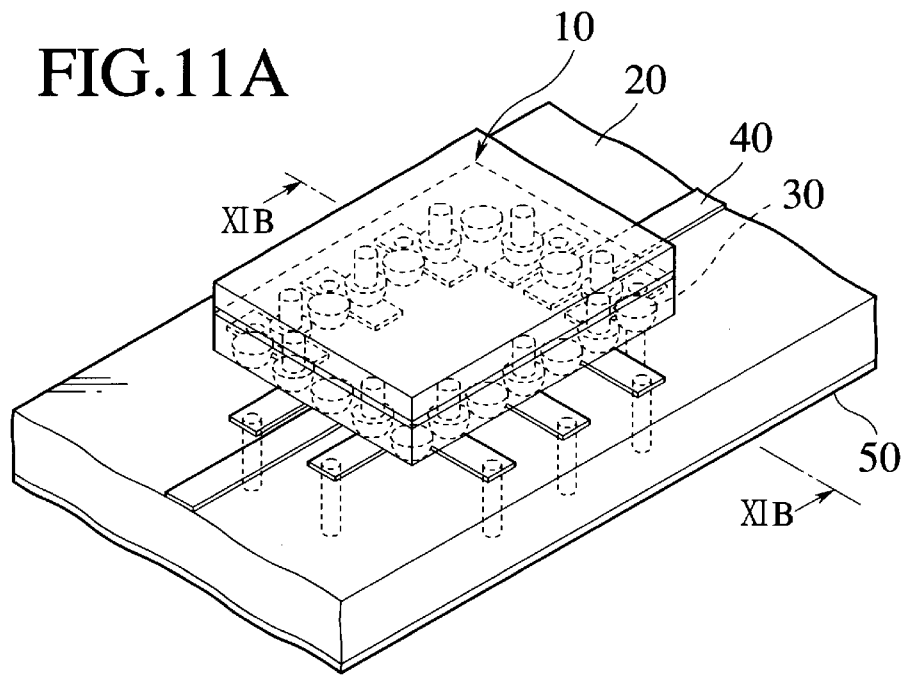
FIGS. 11A and 11B are perspective and sectional views showing an MMIC module according to embodiment 1.8 based on the first aspect.
Figure 11B:
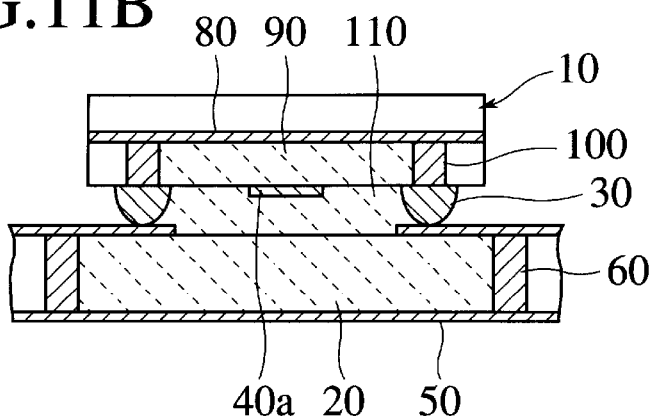

FIG. 11A is a perspective view showing an MMIC module consisting of an MMIC chip 10 flip-chip-mounted on a board 20, according to embodiment 1.8 of the present invention. FIG. 11B is a sectional view taken along a line XIB—XIB of FIG. 11A.

The structure of the embodiment 1.8 is fundamentally the same as that of the embodiment 1.7. What is different from the embodiment 1.7 is that the embodiment 1.8 forms no resin seal 70 between the MMIC chip 10 and the board 20.

In FIG. 11B, the ground line 80, through holes 100, and bumps 30 of the MMIC chip 10 and the electrode pads, through holes 60, and ground electrode 50 of the board 20 form a conductor continuum that defines a quasi-cavity. The quasi-cavity includes an air space whose dielectric constant is smaller than resin.

The embodiment 1.8 is effective to increase the resonance frequency fr of the quasi-cavity, like the embodiment 1.7. Compared with the embodiment 1.1, the embodiment 1.8 is easier to make the resonance frequency fr of the quasi-cavity higher than the maximum operation frequency fumax of the MMIC chip 10, i.e., the frequency of signals supplied to the MMIC chip 10.

Figure 11C:
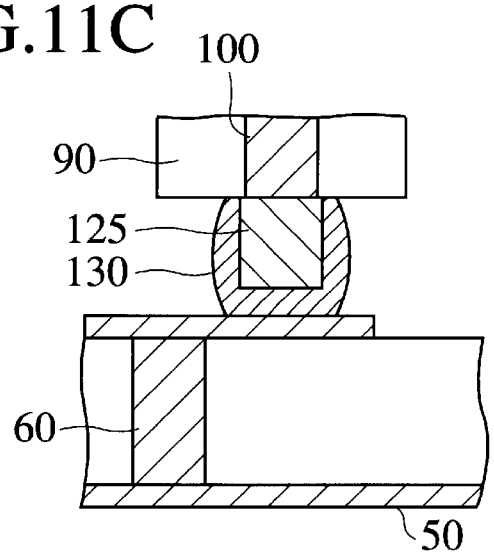
FIG. 11C is a sectional view showing a bump of the MMIC module of the embodiment 1.8.

The larger the air space in the quasi-cavity, the higher the resonance frequency fr of the quasi-cavity. Accordingly, it is preferable to increase the height of the bumps 30. FIG. 11C is a sectional view showing an example of a tall bump. The bump consists of a core 125 made of metal such as copper (Cu) and a solder 130 surrounding the core 125. Since the core 125 supports the bump, the height of the bump is easy to increase.

The structure of FIG. 11C is capable of correctly controlling the height of the bump. Since the height control of bumps is an important factor to determine the resonance frequency fr of the quasi-cavity, the bump of FIG. 11C is applicable to the other embodiments of the present invention.

[Embodiment 1.9]

Figure 12A:
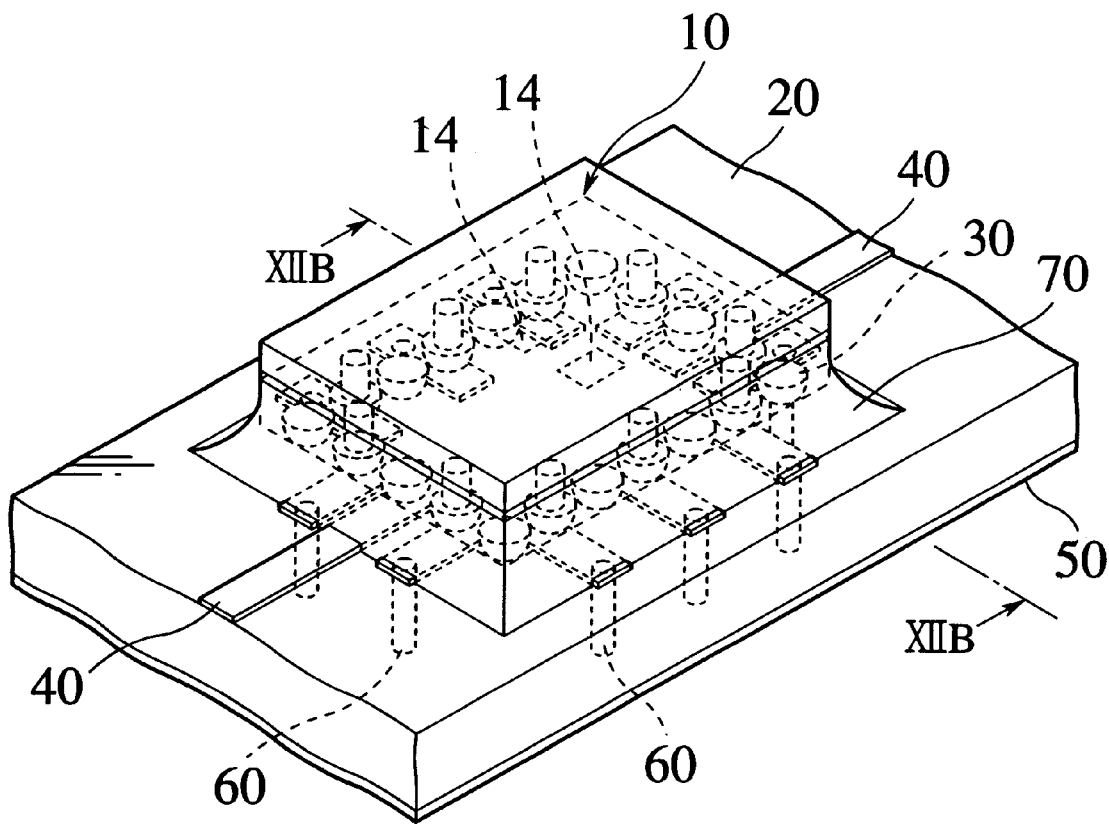
FIGS. 12A and 12B are perspective and sectional views showing an MMIC module according to embodiment 1.9 based on the first aspect.
Figure 12B:
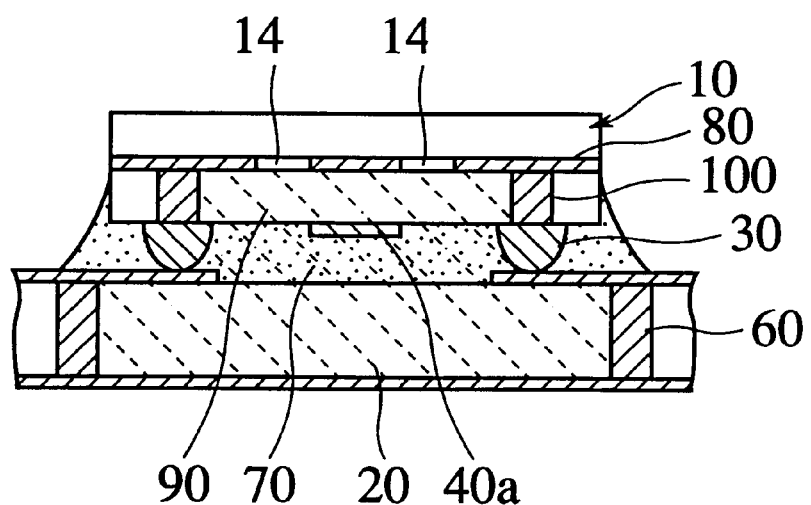

FIG. 12A is a perspective view showing an MMIC module consisting of an MMIC chip 10 flip-chip-mounted on a board 20, according to embodiment 1.9 of the present invention. FIG. 12B is a sectional view taken along a line XIIB—XIIB of FIG. 12A.

The structure of the embodiment 1.9 is fundamentally the same as that of the embodiment 1.1. What is different from the embodiment 1.1 is that the embodiment 1.9 forms at least one opening on a ground line 80 formed on a GaAs substrate of the MMIC chip 10 and a resistor 14 in the opening. In FIGS. 12A and 12B, there are two resistors 14. The resistors 14 are electrically connected to the surrounding ground line 80.

The ground line 80, through holes 100, and bumps 30 of the MMIC chip 10 and the electrode pads, through holes 60, and ground electrode 50 of the board 20 form a conductor continuum that defines a quasi-cavity. The resistors 14 reduce the capacitance of the quasi-cavity, to thereby increase the resonance frequency fr of the quasi-cavity.

Compared with the embodiment 1.1, the embodiment 1.9 is easier to make the resonance frequency fr of the quasi-cavity higher than the maximum operation frequency fumax of the MMIC chip 10, i.e., the maximum frequency of signals supplied to the MMIC chip 10.

[Embodiment 1.10]

Figure 13A:
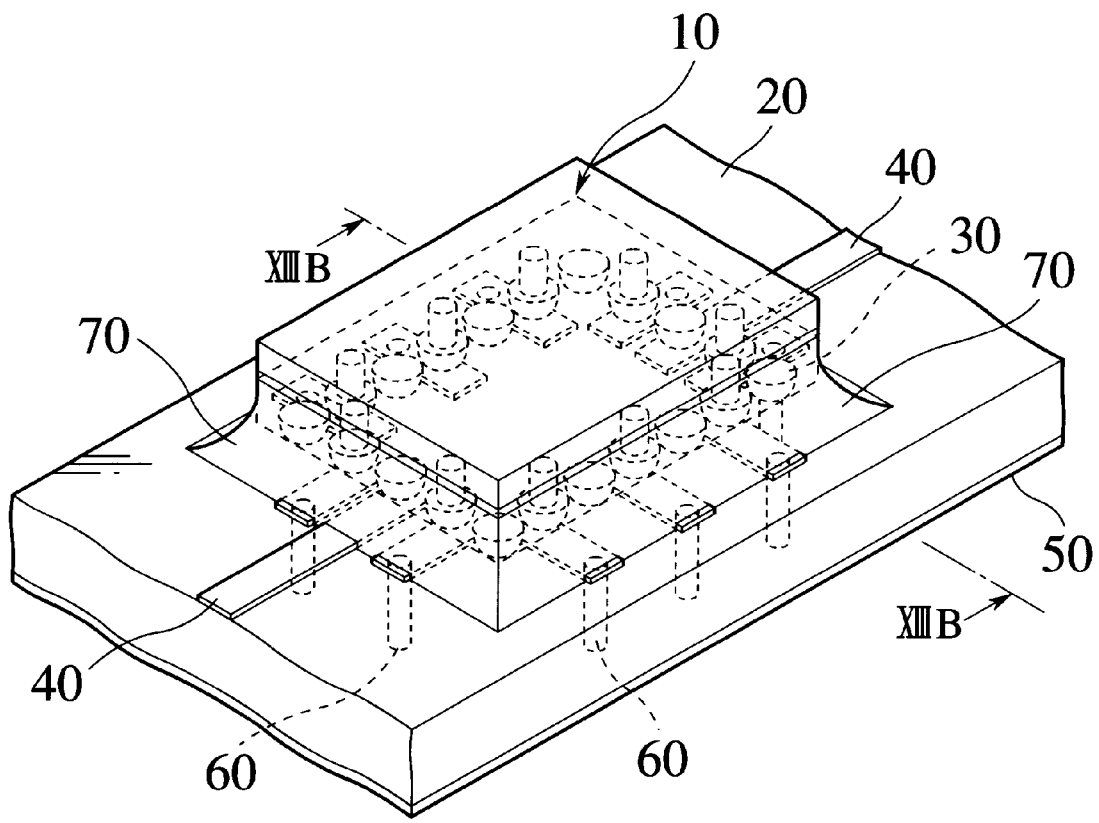
FIGS. 13A and 13B are perspective and sectional views showing an MMIC module according to embodiment 1.10 based on the first aspect.
Figure 13B:
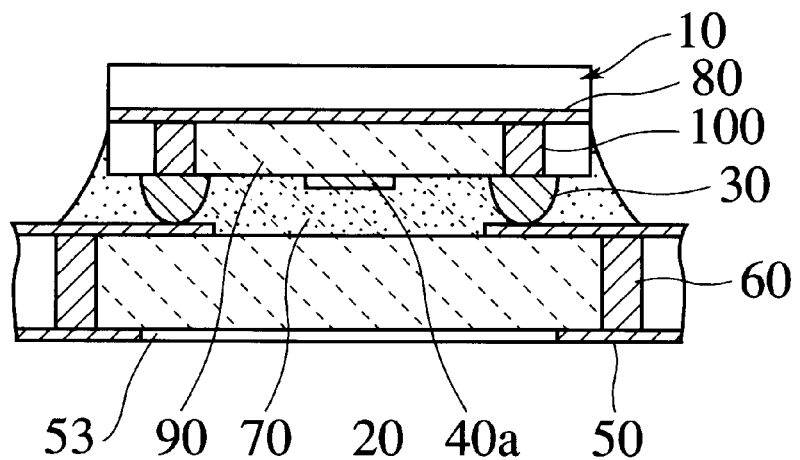

FIG. 13A is a perspective view showing an MMIC module consisting of an MMIC chip 10 flip-chip-mounted on a board 20, according to embodiment 1.10 of the present invention. FIG. 13B is a sectional view taken along a line XIIIB—XIIIB of FIG. 13a.

The structure of the embodiment 1.10 is fundamentally the same as that of the embodiment 1.1. What is different from the embodiment 1.1 is that the embodiment 1.10 forms an opening 53 on a ground electrode 50 formed on the back of the board 20. The opening 53 is within the area of the MMIC chip 10 projected onto the board 20.

The ground line 80, through holes 100, and bumps 30 of the MMIC chip 10 and the electrode pads, through holes 60, and ground electrode 50 of the board 20 form a conductor continuum that defines a quasi-cavity. The opening 53 on the ground electrode 50 reduces the capacitance of the quasi-cavity, to thereby increase the resonance frequency fr of the quasi-cavity.

Compared with the embodiment 1.1, the embodiment 1.10 is easier to make the resonance frequency fr of the quasi-cavity higher than the maximum operation frequency fumax of the MMIC chip 10, i.e., the maximum frequency of signals supplied to the MMIC chip 10.

If the opening 53 on the ground electrode 50 is widened to the size of the MMIC chip 10, the ground electrode 50 will not serve to form the conductor continuum that defines the quasi-cavity. Namely, the quasi-cavity is eliminated, and there will be no resonance related to the quasi-cavity. Then, there is no need of considering such a resonance.

[Embodiment 1.11]

Figure 14A:
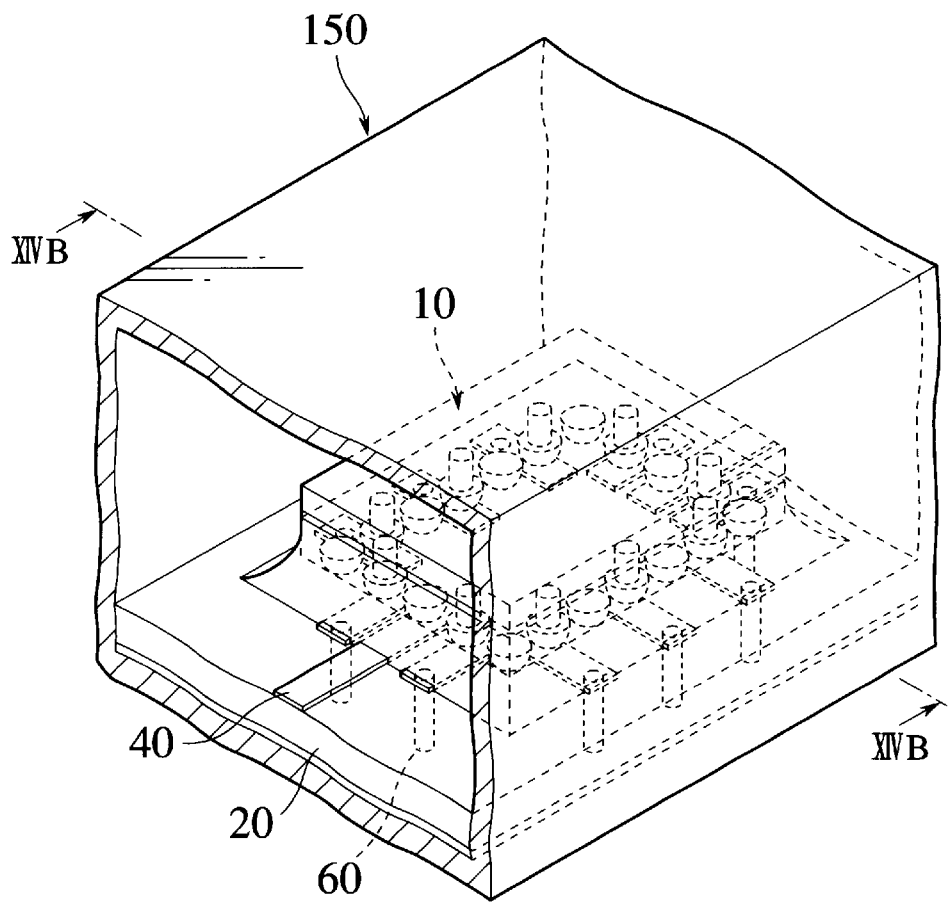
FIGS. 14A and 14B are perspective and sectional views showing an MMIC module according to embodiment 1.11 based on the first aspect.
Figure 14B:
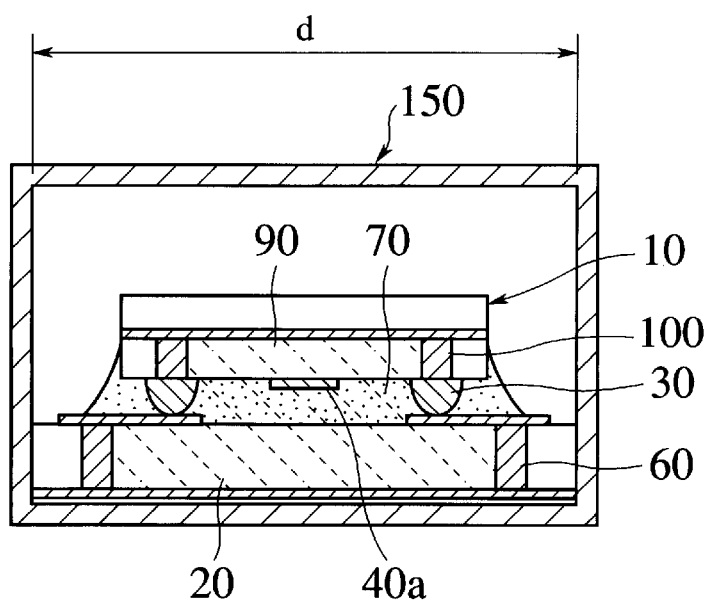

FIG. 14A is a perspective view showing an MMIC module according to embodiment 1.11 of the present invention, and FIG. 14B is a sectional view taken along a line XIVB—XIVB of FIG. 14A.

The embodiment 1.11 is characterized by putting the MMIC module of the embodiment 1.1 in a rectangular metal pipe 150. A hollow in the pipe 150 corresponds to a waveguide to block incoming signals higher than a cutoff frequency fc1, to thereby stabilize the operation of the MMIC chip 10.

The cutoff frequency fc1 of the waveguide is expressed as 1/2d where d is the width of the pipe 150. The cutoff frequency fc1 must be higher than the maximum operation frequency fumax of the MMIC chip 10. Namely, the cutoff frequency fc1 must be as follows:

$$fc1 = \frac{c}{2d} > fumax \qquad (9)$$

The embodiment 1.11 designs the MMIC module to satisfy fc1>fumax, and fr>fumax, to stabilize the operation of the MMIC chip 10.

Although the embodiment 1.11 accommodates the MMIC module of the embodiment 1.1 in the pipe 150, any one of the modules of the other embodiments may be installed in the pipe 150, to provide the same effect.

[Embodiment 1.12]

Figure 15A:
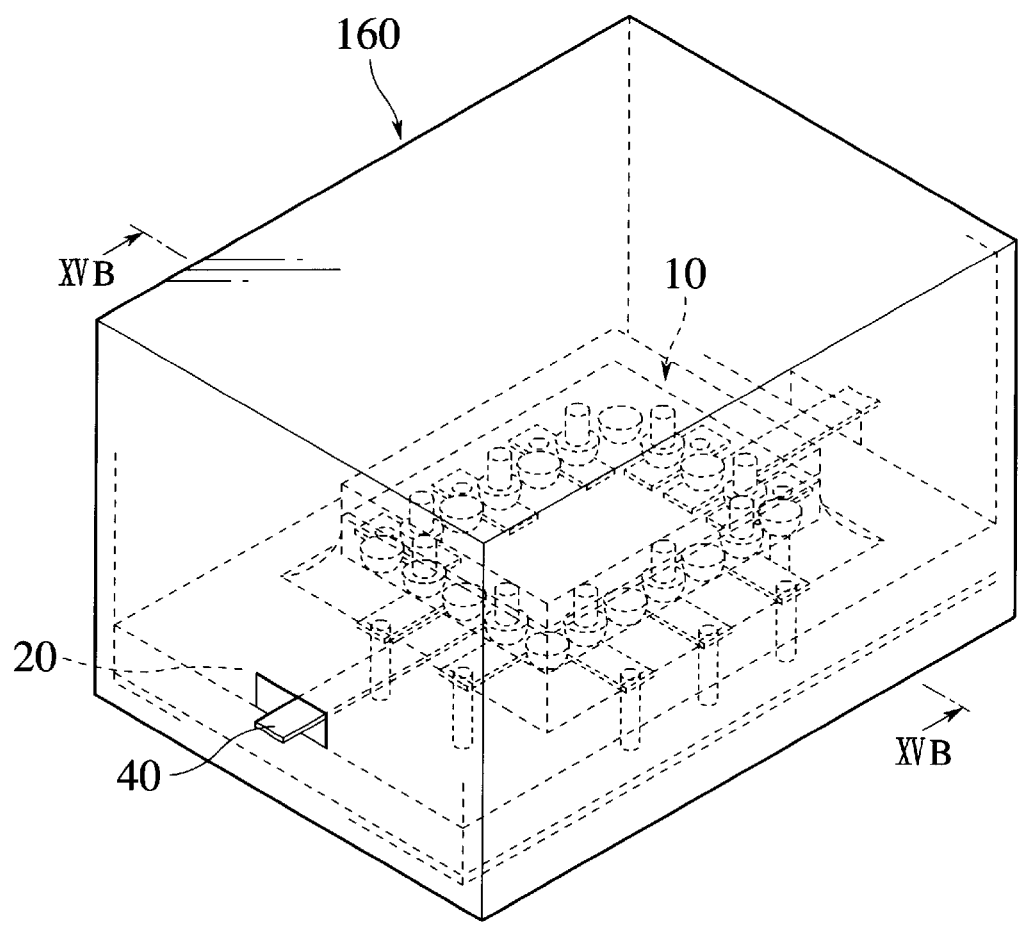
FIGS. 15A and 15B are perspective and sectional views showing an MMIC module according to embodiment 1.12 based on the first aspect.
Figure 15B:
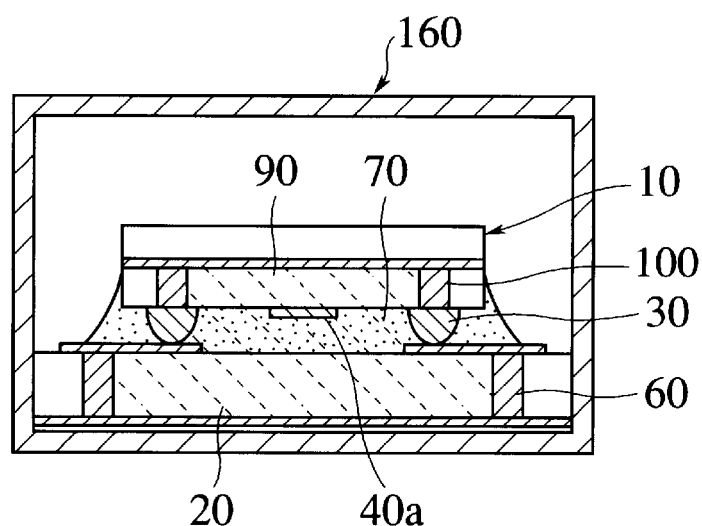

FIG. 15A is a perspective view showing an MMIC module according to embodiment 1.12 of the present invention, and FIG. 15B is a sectional view taken along a line XVB—XVB of FIG. 15A.

The embodiment 1.12 is characterized by putting the MMIC module of the embodiment 1.1 in a metal box 160.

In addition to the quasi-cavity formed in the MMIC module, the metal box 160 forms a cavity, which is larger than the quasi-cavity. Accordingly, the resonance frequency fc2 of the cavity of the metal box 160 is smaller than the resonance frequency fr of the quasi-cavity. Accordingly, the MMIC module must be designed to make the resonance frequency fc2 higher than the maximum operation frequency fumax of the MMIC chip 10.

However, if the equivalent dielectric constant of the quasi-cavity is greater than that of the cavity of the metal box 160, the resonance frequency fc2 has a possibility of exceeding the resonance frequency fr. In this case, the MMIC module must be designed to make the resonance frequency fr higher than the maximum operation frequency fumax. This condition is already met by the MMIC module of the embodiment 1.1.

Consequently, the embodiment 1.12 employing the metal box 160 designs the MMIC module to satisfy fc2>fr, and fc2>fumax, to stabilize the operation of the MMIC chip 10.

Although the embodiment 1.12 accommodates the MMIC module of the embodiment 1.1 in the metal box 160, any one of the MMIC modules of the other embodiments may be installed in the metal box 160, to provide the same effect.

Although various embodiments based on the first aspect of the present invention have been explained, the present invention is not limited to them.

II. Second Aspect

[II-a. Second problem in MMIC module designing: leakage magnetic field from MIM capacitor]

Figure 16A:
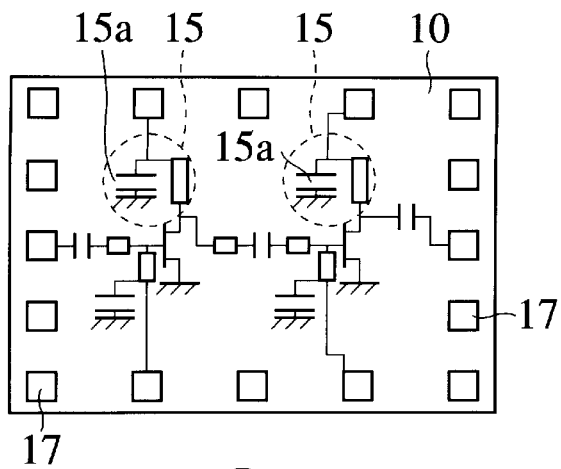
FIGS. 16A to 16C are a circuit diagram and plan views showing an MMIC module based on the second aspect of the present invention.

FIG. 16A is a block diagram showing an MMIC chip flip-chip-mounted on a board. For handling superhigh-frequency signals such as millimeter signals, the MMIC chip has short-circuit stubs 15 serving as bias circuits for transistors. Each short-circuit stub 15 has an MIM capacitor 15a connected to an end of a transmission line whose length is about λ/4 where λ is a wavelength to handle. The MIM capacitor 15a makes impedance for the transistor substantially infinite so that signal components are properly transmitted without leaking to the bias circuit.

Figure 16B:
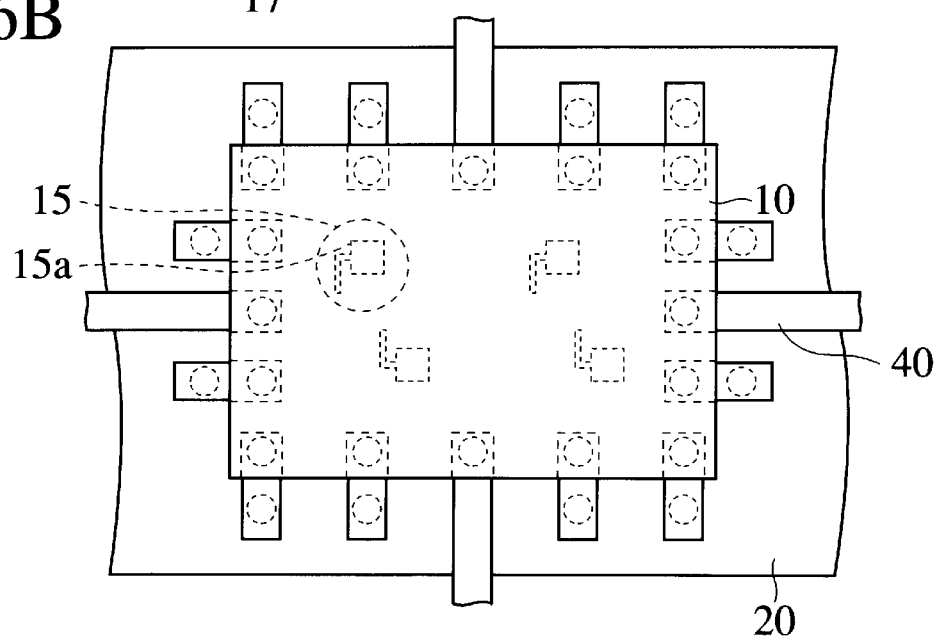

FIG. 16B is a plan view showing the MMIC chip. Each short-circuit stub 15 consists of the MIM capacitor 15a indicated with a dotted rectangle and an L-shaped lead. Although four short-circuit stubs 15 are shown in the figure, the number and locations thereof are optional in practice.

Figure 16C:
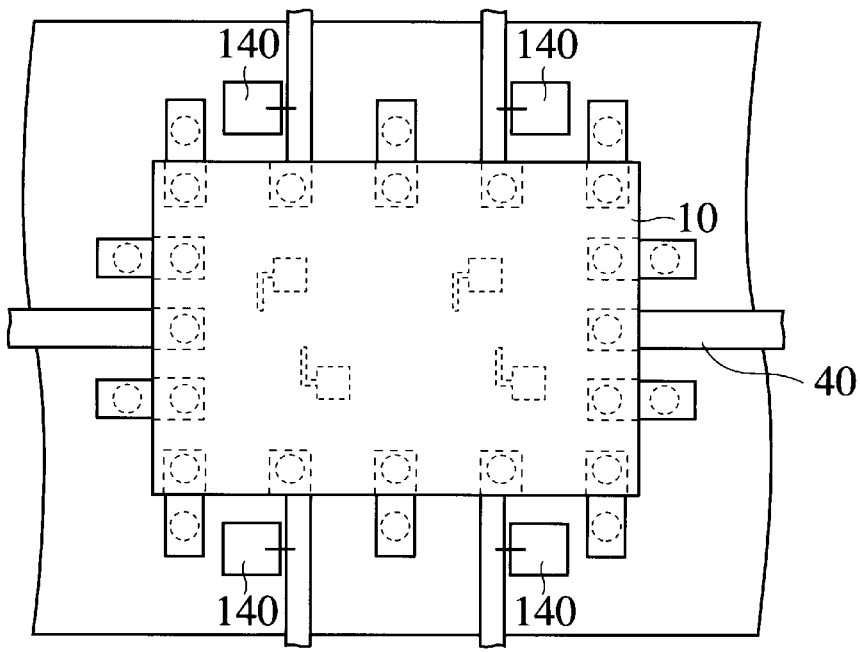

Around the MMIC chip, power stabilizing parts such as decoupling capacitors are usually arranged. FIG. 16C is a plan view showing such decoupling capacitors 140 arranged in the vicinity of the periphery of the MMIC chip.

Figure 17:
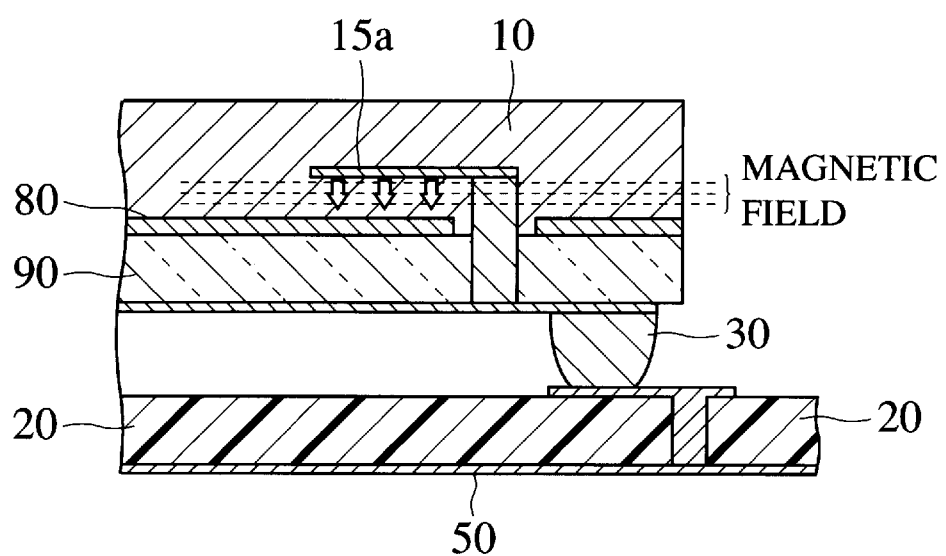
FIG. 17 is a partial sectional view showing the MMIC module of the second aspect.

FIG. 17 is a partial sectional view showing the MIM capacitor 15a of the short-circuit stub 15 of the MMIC chip. The MIM capacitor 15a is formed on a GaAs substrate. A thin-film microstrip transmission line is formed on the MIM capacitor 15a. The MIM capacitor 15a has a positive electrode formed outside the thin-film microstrip transmission line, and a negative electrode that is common to a ground line 80 of the thin-film microstrip transmission line.

The MIM capacitor 15a is a part of the bias circuit serving for a transistor. For the transistor, the impedance of the bias circuit is infinite, and therefore, no signal components leak to the bias circuit. But, the MIM capacitor 15a itself involves low impedance to pass a large displacement current to the ground line 80. The present inventors found that the displacement current produced a magnetic field around the MIM capacitor 15a as indicated with dotted lines in the figure. The magnetic field spreads not only around the MIM capacitor 15a but also around the MMIC chip.

The leakage magnetic field badly affects the characteristics of electronic parts such as the decoupling capacitors 140 (FIG. 16C) arranged around the MMIC chip.

Figure 18A:
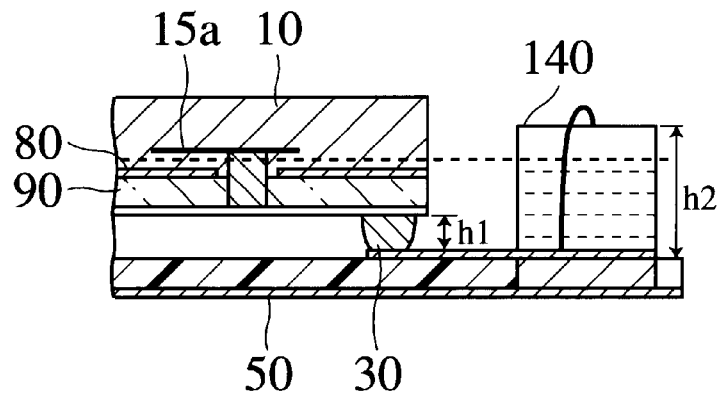
FIGS. 18A and 18B are partial sectional and plan views showing magnetic fields produced by an MIM capacitor in the MMIC module of the second aspect.
Figure 18B:
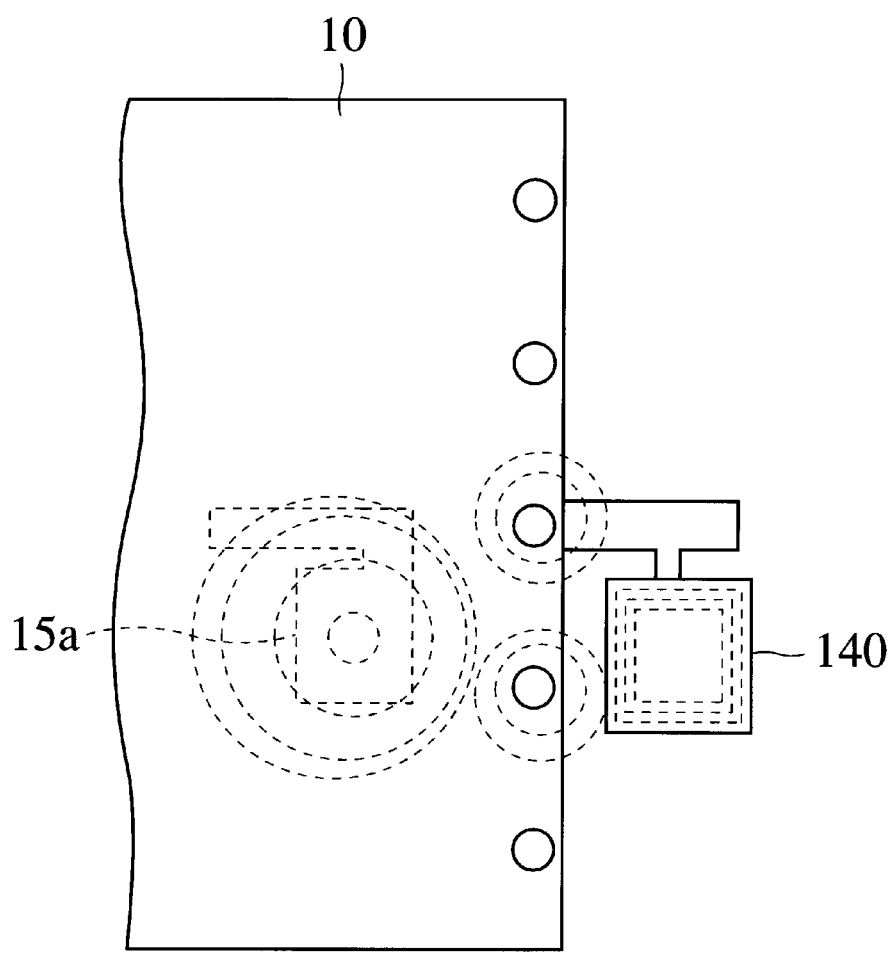

FIGS. 18A and 18B are sectional and plan views showing part of the MMIC module having the decoupling capacitors 140. The MIM capacitor 15a produces a leakage magnetic field that reaches the decoupling capacitor 140. The leakage magnetic field strongly electromagnetically couples with the decoupling capacitor 140, to deteriorate the characteristics of the bias circuit that includes the MIM capacitor 15a.

In an MMIC chip flip-chip mounted on a board, a bump height h1 is lower than a decoupling capacitor height h2. And there, a positive electrode of an MIM capacitor 15a and dielectric layers of a decoupling capacitor 140 are arranged in the almost same height. So, the decoupling capacitor 140 is strongly affected by the leakage magnetic field from the MIM capacitor 15a.

Figure 19A:
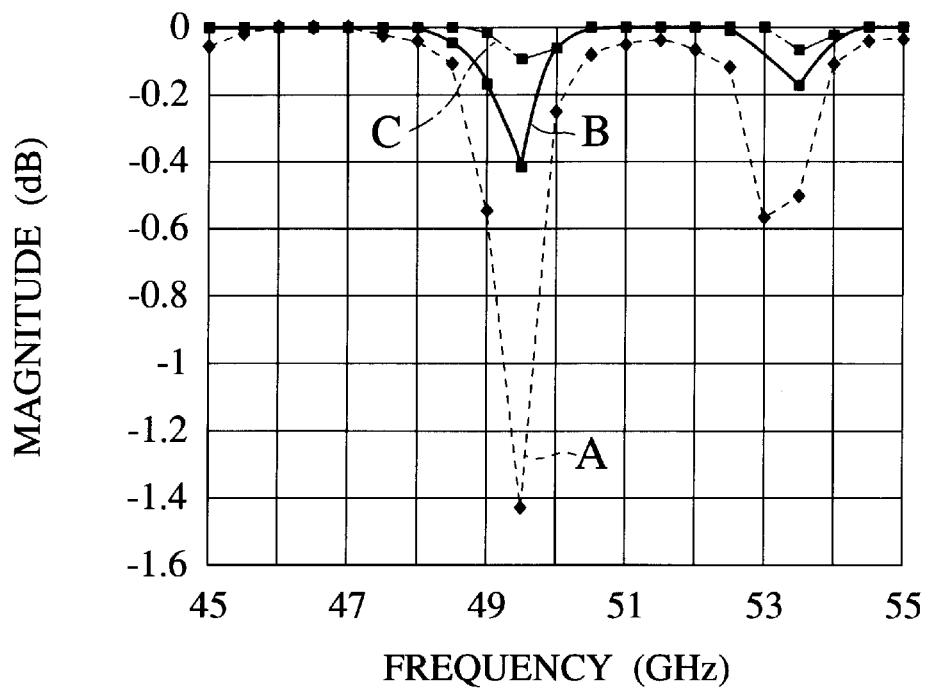
FIGS. 19A and 19B are graphs showing simulation results of the characteristics of a bias circuit of the MMIC module of the second aspect.
Figure 19B:
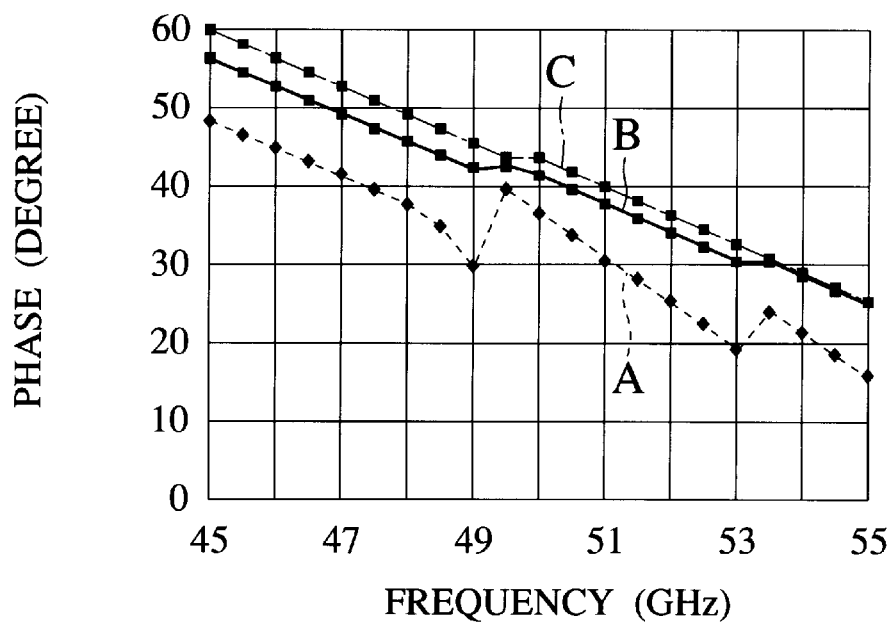

The present inventors simulated the characteristics of the bias circuit of FIG. 18A. Curves A in FIGS. 19A and 19B show results of the simulations where a size of the decoupling capacitor is 0.2 mm×0.2 mm×0.1 mm, a dielectric constant of dielectric layers in the decoupling capacitor is 1000. The decoupling capacitor 140 self-resonates at 49.5 GHz and 53.0 GHz. The curves A of FIGS. 19A and 19B show that strong electromagnetic coupling occurs between the decoupling capacitor 140 and a leakage magnetic field at the self-resonance frequencies of the decoupling capacitor 140.

From these simulation results, the present inventors concluded that electromagnetic fields produced by MIM capacitors had to be blocked from reaching electronic parts around an MMIC chip, such as decoupling capacitors, to stabilize bias characteristics.

Superhigh-frequency MMIC modules capable of preventing leakage magnetic fields according to embodiments of the present invention will be explained.

[Embodiment 2.1]

Figure 20A:
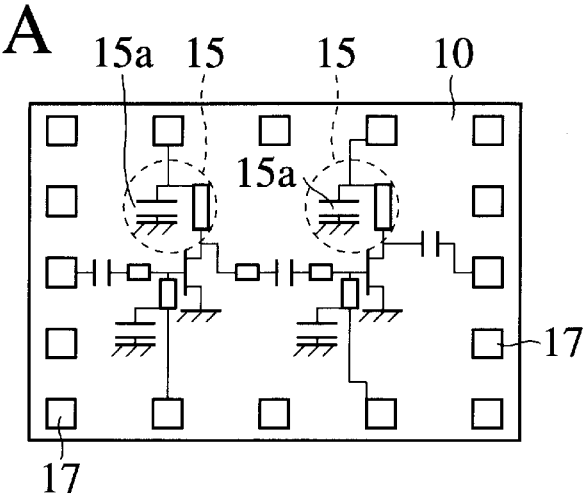
FIGS. 20A to 20C are circuit diagram, plan view, and sectional view showing an MMIC module according to embodiment 2.1 based on the second aspect.
Figure 20B:
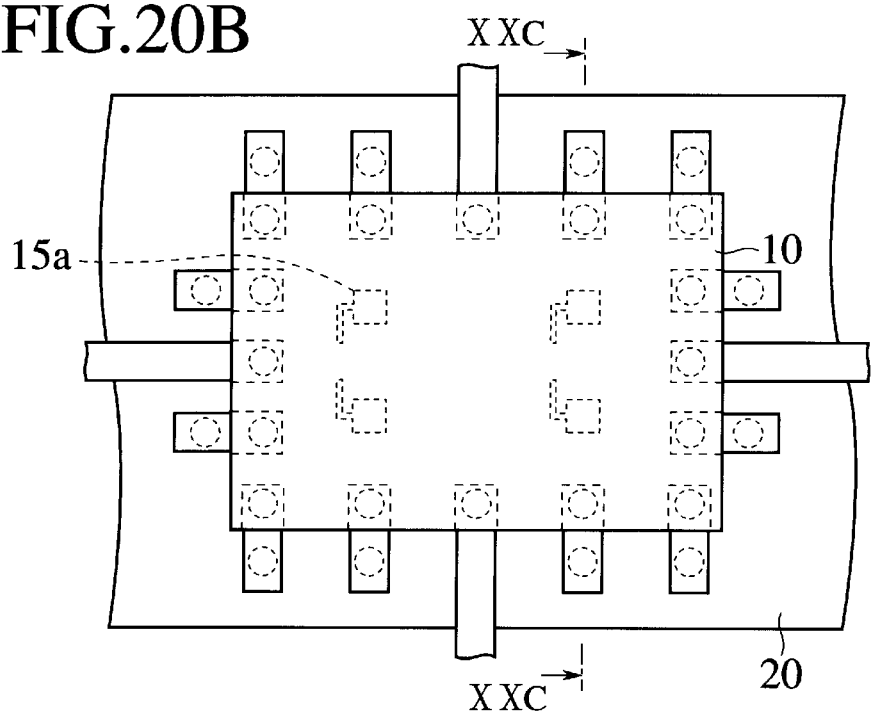

FIG. 20A is a simple circuit diagram showing an MMIC module according to embodiment 2.1 of the present invention. This circuit diagram is fundamentally the same as that of FIG. 16A. FIG. 20B is a plan view showing the MMIC module with short-stub circuits 15 having MIM capacitors 15a. Although the MIM capacitors 15a are linearly aligned with corresponding bumps, an actual arrangement thereof is dependent on other elements. The arrangement of FIG. 20B is fundamentally the same as that of FIG. 16B.

Figure 20C:
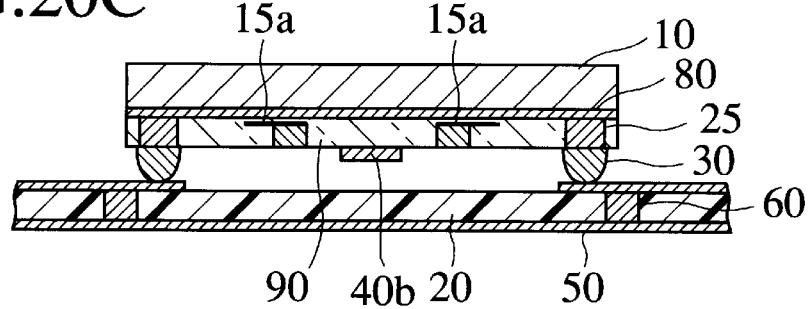

FIG. 20C is a sectional view taken along a line XXC—XXC of FIG. 20B. An MMIC chip 10 is flip-chip-mounted on a board 20 through bumps 30. A ground electrode 50 is formed on the back of the board 20. The MMIC chip 10 has a thin-film microstrip transmission line, which consists of a ground line 80 formed on the surface of a GaAs substrate, a dielectric layer 90 formed on the ground line 80, and a signal line 40b formed on the dielectric layer 90.

Similar to the first aspect of the present invention, the ground line 80, through holes 25, and bumps 30 of the MMIC chip 10 and the electrode pads, through holes 60, and ground electrode 50 of the board 20 form a conductor continuum that defines a quasi-cavity.

The embodiment 2.1 is characterized in that the positive electrode of each MIM capacitor 15a is formed within the quasi-cavity, and the negative electrode of the MIM capacitor 15a is common to the ground line 80. The MIM capacitors 15a are entirely within the quasi-cavity, so that magnetic fields produced by them hardly leak to the outside of the quasi-cavity due to the shield effect of the quasi-cavity. As a result, electronic parts around the MMIC chip 10 are free from the influence of the magnetic fields.

[Embodiment 2.2]

Figure 21A:
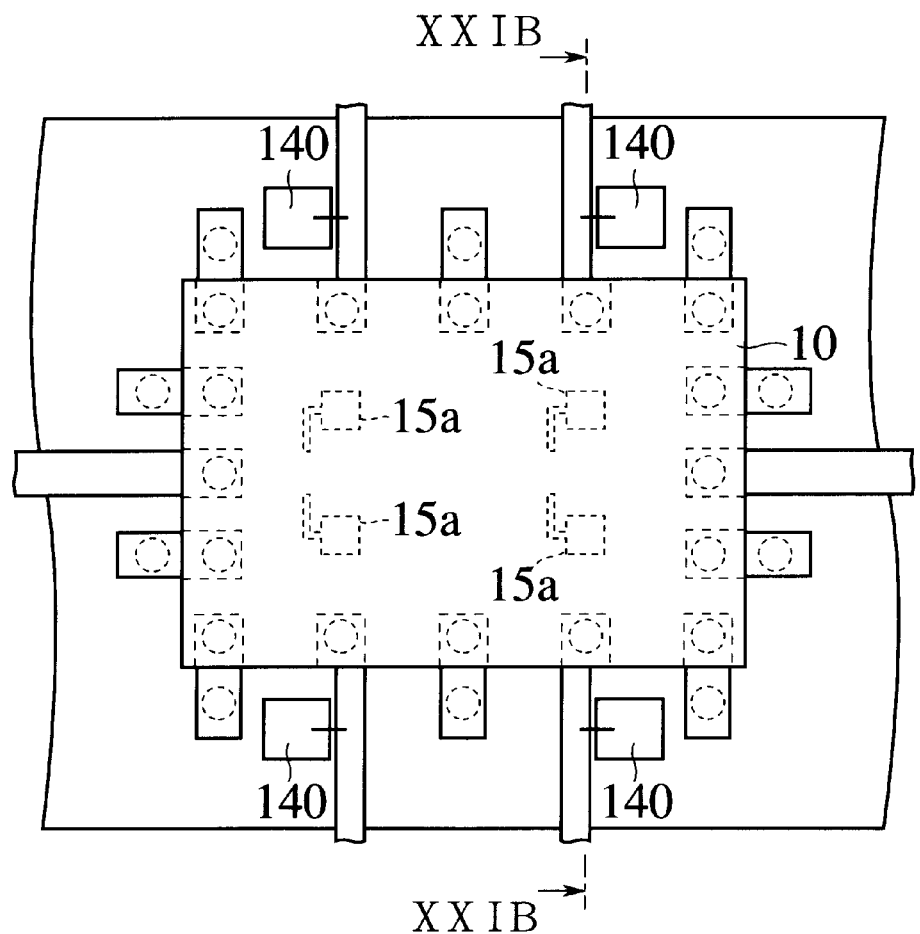
FIGS. 21A and 21B are plan and sectional views showing an MMIC module according to embodiment 2.2 based on the second aspect.
Figure 21B:
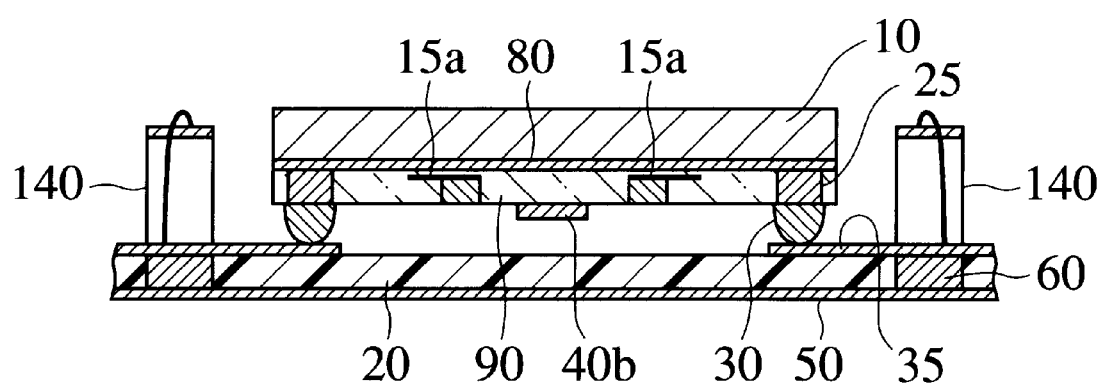

FIG. 21A is a plan view showing an MMIC module consisting of an MMIC chip 10 flip-chip-mounted on a board 20, according to embodiment 2.2 of the present invention. FIG. 21B is a sectional view taken along a line XXIB—XXIB of FIG. 21A. The MMIC chip 10 is of the embodiment 2.1, and the embodiment 2.2 arranges coupling capacitors 140 around the MMIC chip 10.

The ground line 80, through holes 25, and bumps 30 of the MMIC chip 10 and the electrode pads 35, through holes 60, and ground electrode 50 of the board 20 form a conductor continuum that defines a quasi-cavity in which the MIM capacitors 15a are formed.

Magnetic fields produced by the MIM capacitors 15a are shielded by the quasi-cavity. In particular, the bumps 30 interposing between the MIM capacitors 15a and the decoupling capacitors 140 are effective to prevent the magnetic fields from reaching the decoupling capacitors 140.

Returning to the simulation results of FIGS. 19A and 19B, curves B represent the characteristics of the bias circuits of the embodiment 2.2. Compared with the curves A of the MMIC module of FIGS. 18A and 18B with the MIM capacitors 15a being formed outside the quasi-cavity, the embodiment 2.2 greatly reduces the magnitude of electromagnetic coupling at the self-resonance frequencies of the decoupling capacitors 140. These graphs indicate that arranging the MIM capacitors 15a within the quasi-cavity is effective to block magnetic fields from spreading outside.

[Embodiment 2.3]

Figure 22A:
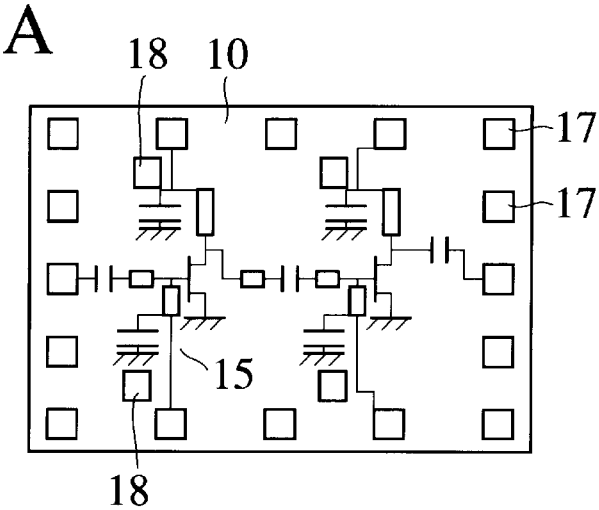
FIGS. 22A to 22C are circuit diagram, plan view, and sectional view showing an MMIC module according to embodiment 2.3 based on the second aspect.

FIG. 22A is a simple circuit diagram showing an MMIC module according to embodiment 2.3 of the present invention. This circuit diagram is fundamentally the same as that of FIG. 16A. The embodiment 2.3 is characterized in that via pads 18 are arranged between rectangular bump pads 17, which are arranged along the periphery of an MMIC chip 10, and short-circuit stubs 15.

Figure 22B:
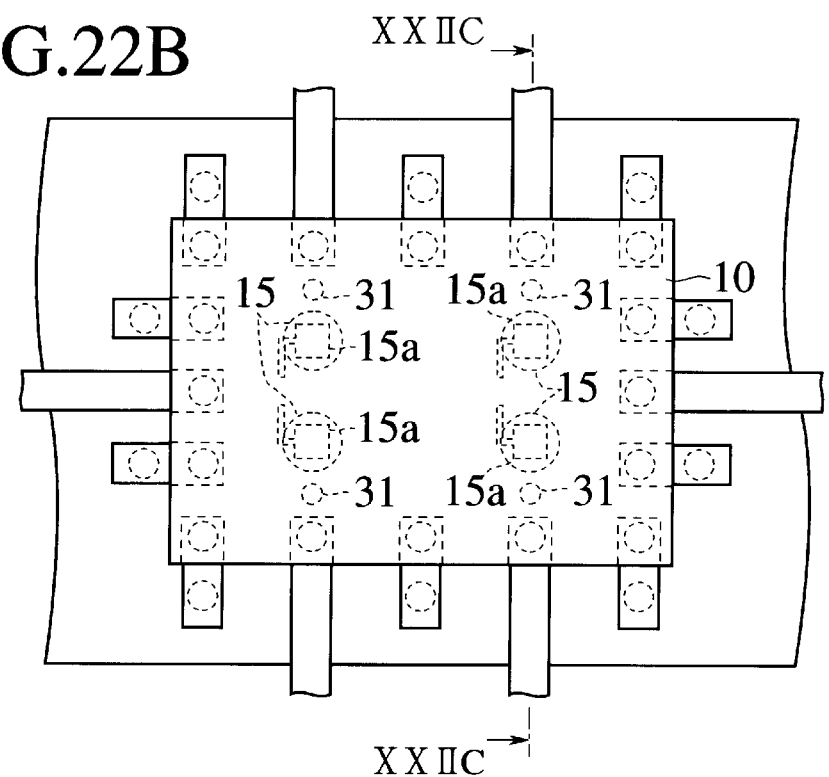

FIG. 22B is a plan view showing the MMIC module with the short-circuit stubs 15 and vias 31. For the sake of simplicity, MIM capacitors 15a and corresponding bumps and the vias 31 are linearly aligned with one another.

Figure 22C:
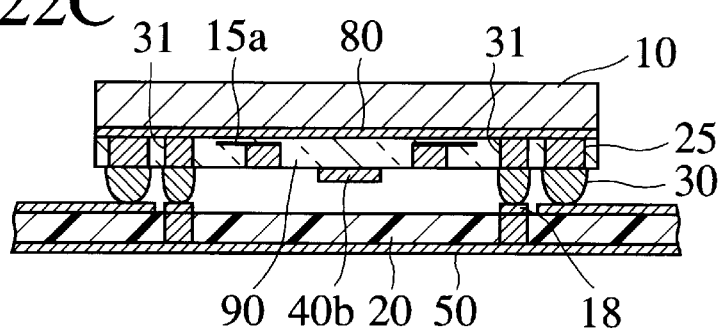

FIG. 22C is a sectional view taken along a line XXIIC—XXIIC of FIG. 22B. The MMIC module of the embodiment 2.3 has, in addition to the elements of the embodiment 2.1, the vias 31. The vias 31 electrically connect a ground line 80 on a GaAs substrate of the MMIC chip 10 to a ground electrode 50 on the back of a board 20. Each via 31 consists of a through hole and a bump both formed on a dielectric layer 90 and a through hole made on the board 20.

The vias 31 interpose between the MIM capacitors 15a and the bumps 30, to effective block magnetic fields generated by the MIM capacitors 15a. The embodiment 2.3, therefore, provides a more effective magnetic field shield than the embodiment 2.1.

[Embodiment 2.4]

Embodiment 2.4 provides an MMIC module that arranges decoupling capacitors 140 around the MMIC chip of the embodiment 2.3.

Figure 23A:
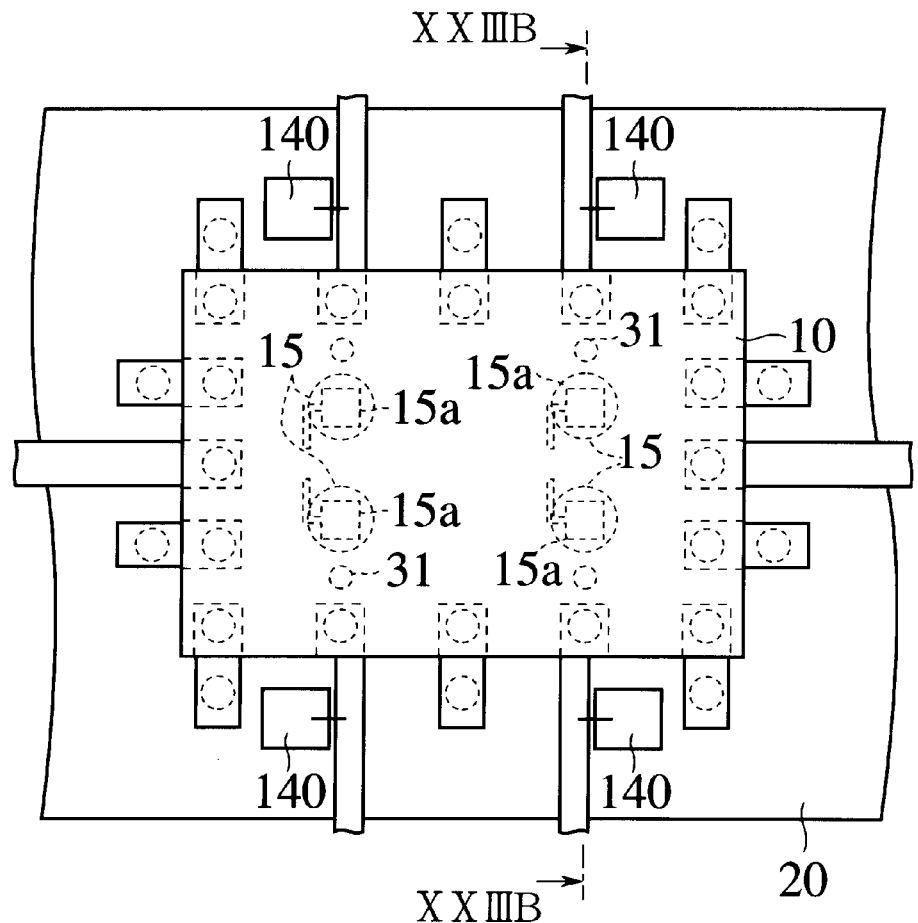
FIGS. 23A and 23B are plan and sectional views showing an MMIC module according to embodiment 2.4 based on the second aspect.

FIG. 23A is a plan view showing the MMIC module of the embodiment 2.4 with the short-circuit stubs 15, vias 31, and decoupling capacitors 140. For the sake of simplicity, the MIM capacitors 15a and corresponding vias 31 are linearly aligned with each other.

Figure 23B:
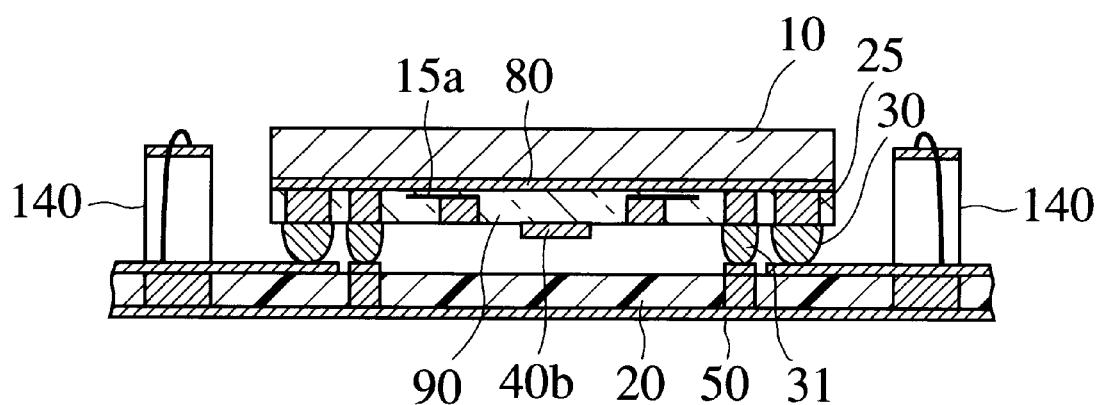

FIG. 23B is a sectional view taken along a line XXIIIB—XXIIIB of FIG. 23A. The decoupling capacitors 140 are arranged around the MMIC chip 10.

Returning to the simulation results of FIGS. 19A and 19B, curves C represent the characteristics of the bias circuits of the embodiment 2.4. Compared with the curves B of the embodiment 2.2 that simply forms the MIM capacitors 15a within the quasi-cavity, the embodiment 2.4 further reduces the magnitude of electromagnetic coupling at 49.5 GHz and 53.0 GHz.

As explained above, short-circuit stubs arranged in an MMIC chip generate magnetic fields due to MIM capacitors that form the short-circuit stubs. The magnetic fields may leak outside and couple with electronic parts arranged around the MMIC chip, to deteriorate the characteristics of bias circuits that involve the short-circuit stubs. To solve this problem, the embodiments 2.1 to 2.4 of the present invention form the MIM capacitors within a quasi-cavity in the MMIC module, or arranges vias between the MIM capacitors and the electronic parts, to reduce the leakage of the magnetic fields to the outside of the MMIC chips and prevent electromagnetic coupling that deteriorates the characteristics of the bias circuits.

The numbers and locations of the vias, short-circuit stubs, bumps, etc., shown in the embodiments do not limit the present invention.

III. Third Aspect

[III-a. Third problem in MMIC module designing: relationship between substrate thickness and signal isolation]

Figure 24A:
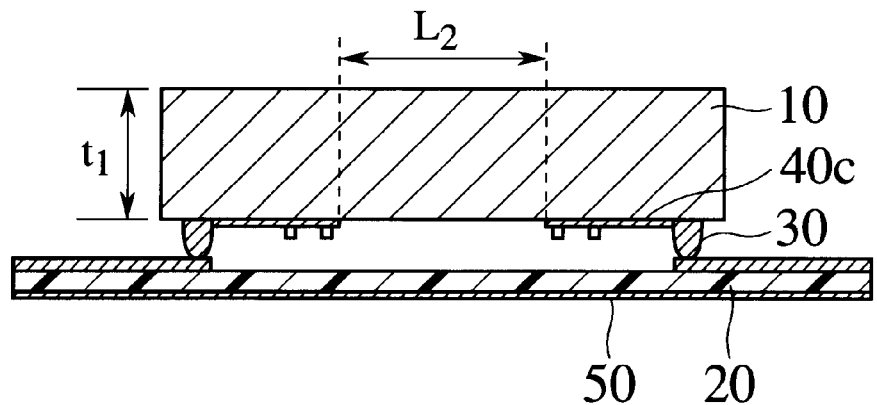
FIG. 24A is a sectional view showing an MMIC module having a coplanar waveguide transmission line related to the third aspect of the present invention.
Figure 24B:
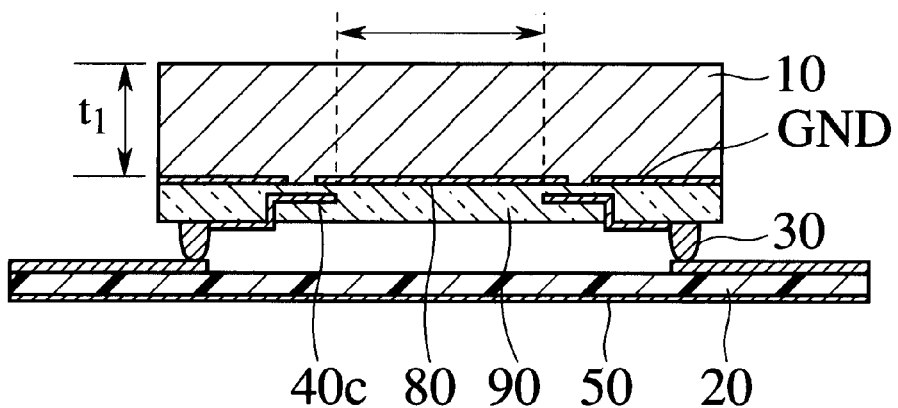
FIG. 24B is a sectional view showing an MMIC module having a thin-film microstrip transmission line related to the third aspect.
Figure 24C:
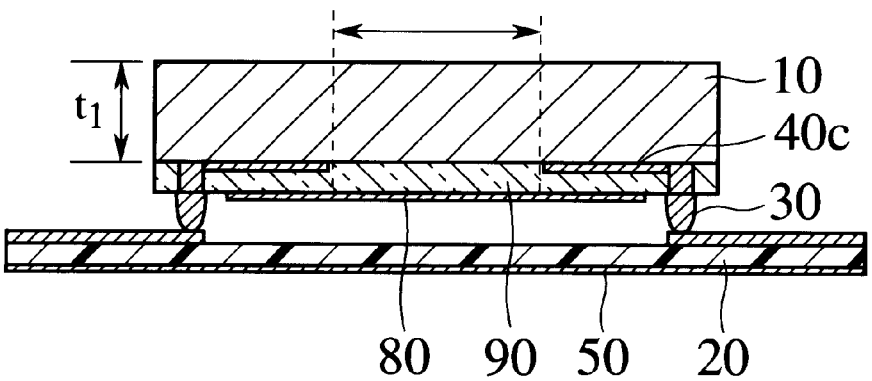
FIG. 24C is a sectional view showing an MMIC module having an inverted thin-film microstrip transmission line related to the third aspect.

FIGS. 24A, 24B, and 24C are sectional views showing MMIC modules having a coplanar waveguide transmission line, thin-film microstrip transmission line, and inverted thin-film microstrip transmission line, respectively.

The coplanar and inverted thin-film microstrip transmission lines have each a signal line 40c directly formed on a GaAs substrate. The thin-film microstrip transmission line has a signal line 40c formed on a dielectric layer 90 that is formed on a GaAs substrate.

MMIC modules having each of these three transmission lines has a laminated structure consisting of a conductor film (ground line 80) and a dielectric layer (GaAs substrate) formed thereon. This laminated structure is a "transmission line consisting of a conductor and a thin dielectric film formed thereon." Namely, it is understood that an MMIC chip has, in addition to an original transmission line, a parasitic transmission line, i.e., the "transmission line consisting of a conductor and a thin dielectric layer formed thereon." To distinguish these transmission lines from each other, the original transmission line is called the "main transmission line" and the parasitic one the "parasitic transmission line" hereunder.

The MMIC chip having the coplanar or inverted thin-film microstrip transmission line has a main transmission line directly on the GaAs substrate. Accordingly, an electromagnetic field produced by the main transmission line enters the GaAs substrate, i.e., the parasitic transmission line, to couple the main and parasitic transmission lines together.

In the main transmission line, input and output sides are separated from each other with a sufficient gap between them. In the parasitic transmission line, input and output sides are continuous. If the main and parasitic transmission lines couple together, isolation between the input and output sides of the main transmission line deteriorates.

The MMIC chip with the thin-film microstrip transmission line has active elements on the surface of the GaAs substrate where contacts between the active elements and the main transmission line are made. Accordingly, there is a possibility of the main transmission line coupling with the parasitic transmission line, similar to the MMIC chip having the coplanar or inverted thin-film microstrip transmission line.

Generally, the cutoff frequency fc of a transmission mode of the "transmission line consisting of a conductor and a thin dielectric film formed thereon" is expressed as follows:

$$fc(TMn \text{ mode}) = \frac{n \cdot c}{2t\sqrt{\varepsilon r - 1}} \quad (10)$$

$$fc(TEn \text{ mode}) = \frac{(2n-1) \cdot c}{4t\sqrt{\varepsilon r - 1}} \quad (11)$$

where t is the thickness of the dielectric film, εr is the dielectric constant thereof, and c is the velocity of light. These expressions tell that the cutoff frequency of the lowest-order mode is that of a TM0 mode (cutoff frequency of zero), and the cutoff frequency of a second from the lowest-order mode is that of a TE1 mode.

The parasitic transmission line is understandable from a transmission line mode that employs the GaAs substrate as a dielectric layer. This mode is called the "GaAs substrate mode" hereunder. In the GaAs substrate mode, the cutoff frequency of the TE1 mode in the parasitic transmission line is expressed as follows because the dielectric constant εr of the GaAs substrate is 12.9:

$$fc(TE1 \text{ mode}) = \frac{c}{13.8t} \quad (12)$$

If the GaAs substrate is 0.3 mm thick, the cutoff frequency of the TE1 mode is 72 GHz.

The present inventors made electromagnetic field simulations on MMIC modules having the coplanar, thin-film microstrip, and inverted thin-film microstrip transmission lines each with 1) no stubs, 2) open-circuit stubs parallel to short sides of an MMIC chip, and 3) short-circuit stubs parallel to short sides of an MMIC chip, to test in each case coupling between the GaAs substrate mode and the main transmission line.

Figure 25A:
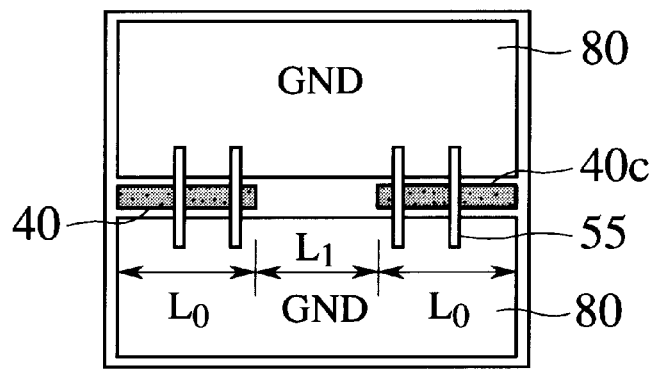
FIG. 25A is a plan view showing an MMIC module having a coplanar waveguide transmission line without stubs related to the third aspect.
Figure 25B:
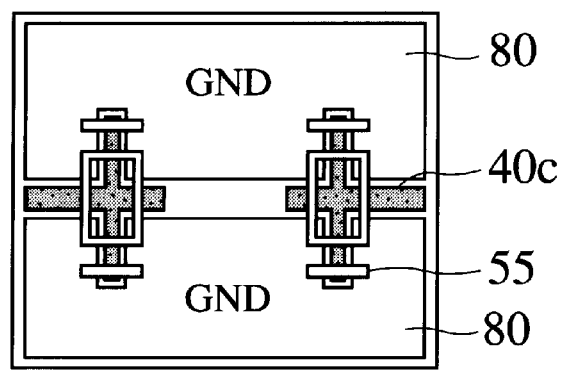
FIG. 25B is a plan view showing an MMIC module having a coplanar waveguide transmission line with short-circuit stubs related to the third aspect.
Figure 25C:
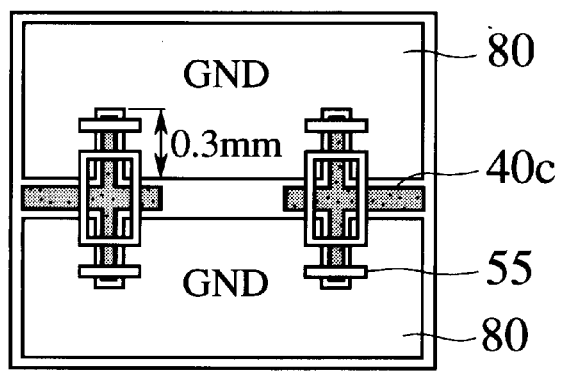
FIG. 25C is a plan view showing an MMIC module having a coplanar waveguide transmission line with open-circuit stubs related to the third aspect.

FIGS. 25A to 25C are plan views showing MMIC chips each having the coplanar waveguide transmission line, with 1) no stubs, 2) open-circuit stubs, and 3) short-circuit stubs, respectively.

In each of FIGS. 25A to 25C, the coplanar waveguide transmission line consists of a ground line 80 and a signal line 40c both formed on the same surface of a GaAs substrate. These lines 80 and 40c are separated from each other with a given gap between them. The ground line 80 is divided into two on the GaAs substrate, and the two are electrically connected to each other through bridges 55 across the signal line 40c.

The simulations were made on MMIC chips each having sizes of 1.2 mm×1.5 mm. Each of the chips had a GaAs substrate of 0.3 mm thick, a signal line 40c of 20 μm wide, and a gap of 15 μm between a ground line 80 and the signal line 40c. The signal line 40c was a main transmission line having input and output sides each having a length L0 of 0.4 mm. The distance L1 between the input and output sides was 0.7 mm to sufficiently isolate input and output signals from each other. Open-circuit stubs and short-circuit stubs were arranged, if required, at pitches of 0.3 mm.

As mentioned above, the simulated MMIC modules included not only those with the coplanar waveguide transmission line but also those with the thin-film and inverted thin-film transmission lines with 1) no stubs, 2) open-circuit stubs, and 3) short-circuit stubs. In the cases with the thin-film and inverted thin-film transmission lines, the MMIC modules had a signal line of 20 μm wide and a dielectric layer 90 of 10 μm thick and 2.7 in dielectric constant. The other conditions were the same as those of the MMIC modules having the coplanar waveguide transmission line.

Figure 26A:
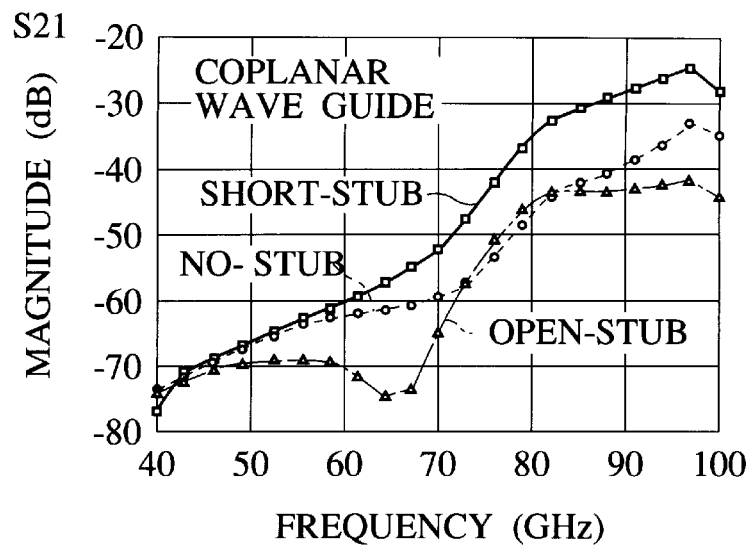
FIGS. 26A to 26C are graphs showing simulation results of the input-output isolation characteristics of MMIC modules that are based on FIGS. 24A to 25C.
Figure 26B:
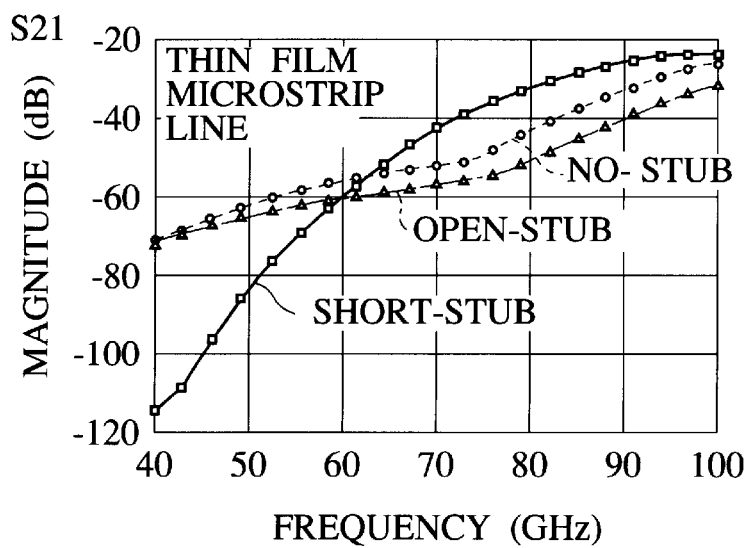
Figure 26C:
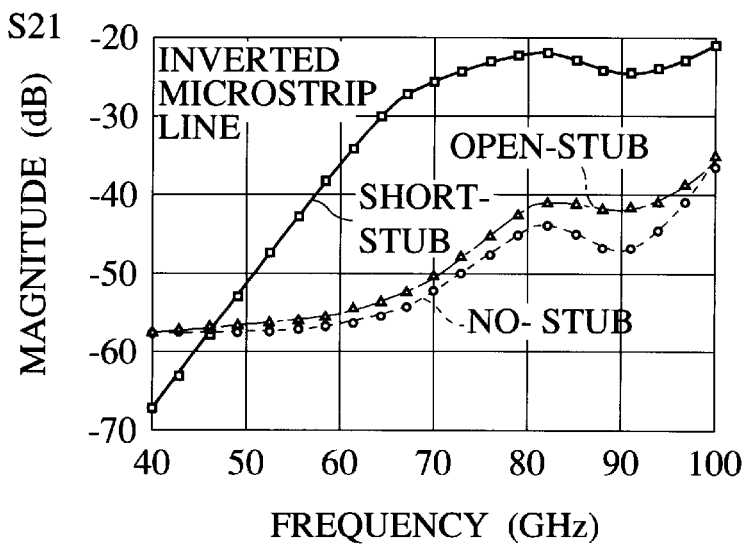

FIGS. 26A to 26C show results of the simulations. More precisely, FIG. 26A shows the isolation characteristics of the MMIC modules having the coplanar waveguide transmission line, FIG. 26B of those having the thin-film microstrip transmission line, and FIG. 26C of those having the inverted thin-film microstrip transmission line. The smaller the absolute isolation values (S21), i.e., the higher the curves, the worse the isolation characteristics.

First, the MMIC modules with short-circuit stubs will be compared among the three types of transmission lines. The MMIC module having the coplanar waveguide transmission line and short-circuit stubs in FIG. 26A shows proper isolation at low frequencies. At frequencies above 60 GHz or 70 GHz, the isolation suddenly worsens. This means that the magnitude of the coupling of the main transmission line with the lowest-order TM0 mode of the GaAs substrate mode (parasitic transmission line) is weak, and that with the TE1 mode of the parasitic transmission line is strong.

The MMIC modules having the thin-film and inverted thin-film microstrip transmission lines with short-circuit stubs in FIGS. 26B and 26C show each bad isolation at relatively low frequencies, and the isolation worsens as the frequencies increase. This is because electromagnetic coupling occurs even in the lowest-order mode TM0. Comparing the isolation values (S21) thereof with each other, it is understood that the thin-film microstrip transmission line is better than the other.

As explained in the second aspect, the short-circuit stub is realized with a combination of an MIM capacitor and a transmission line. In a high-frequency area, the MIM capacitor shows sufficiently low impedance to serve as a DC-short-circuit stub. Accordingly, the simulations regarded the short-circuit stubs as DC-short-circuit stubs.

The MMIC chips usually incorporate active elements such as transistors having an amplification function. If isolation between input and output signals to and from the MMIC chips is improper, the amplification elements worsen the isolation. Accordingly, the MMIC chips having such active elements must maintain proper isolation between input and output signals. The simulation results tell that the MMIC modules having the coplanar or thin-film microstrip transmission line provide better isolation.

The MMIC modules having the three types of transmission lines will be compared with one another in terms of whether they have no stubs or have open-circuit stubs. Irrespective of the types of transmission lines, the MMIC modules with no stubs and with open-circuit stubs show similar isolation characteristics.

The isolation characteristics of the MMIC modules having the thin-film microstrip transmission line start to deteriorate at about the cutoff frequency of about 72 GHz of the TE1 mode of the parasitic transmission line. The MMIC modules having the thin-film microstrip transmission line will show no deterioration in the isolation characteristics due to coupling between the main and parasitic transmission lines, if the maximum operation frequency of each MMIC chip is designed to be lower than the cutoff frequency fc of the TE1 mode of the parasitic transmission line.

The isolation characteristics of the MMIC modules having the coplanar waveguide transmission line show a point of inflection on lower frequency side compared with those of the MMIC modules having the thin-film microstrip transmission line. Among the MMIC modules having the coplanar waveguide transmission line, those with the open- or short-circuit stubs show a point of inflection on lower frequency side compared with those with no stubs. This may be because both the main and parasitic transmission lines of the MMIC modules having the coplanar waveguide transmission line easily leak transmission energy to air.

It is also understood because the thickness of the dielectric layer that determines the actual transmission characteristics of the MMIC modules having the coplanar waveguide transmission line is not equal to the thickness of the GaAs substrate. The coplanar waveguide transmission line involves discontinuity such as T-junction to leak the GaAs substrate mode into a space between the MMIC chip and the board. Most of leakage electromagnetic fields do not enter the board 20 because the dielectric constant of the board 20 is higher than that of air. Accordingly, the effective dielectric thickness that determines the transmission characteristics of the MMIC modules having the coplanar waveguide transmission line must be the sum of the thickness "t" of the GaAs substrate and the height "h" of the bumps, i.e., the gap between the board 20 and the MMIC chip 10. In consideration of such actual dielectric thickness, the cutoff frequency fc of the TE1 mode of the parasitic transmission line is obtained. Then, any MMIC module having the coplanar waveguide transmission line is designed to make the maximum operation frequency fumax thereof lower than the cutoff frequency fc, to avoid coupling between main and parasitic transmission lines in the MMIC module.

As is apparent from the simulation results of FIGS. 26A to 26C, the MMIC modules having the short-circuit stubs parallel to short sides of an MMIC chip easily cause electromagnetic coupling. Therefore, for the MMIC modules having the short-circuit stubs, it is effective to make the cut off frequency fc thereof higher than the maximum operation frequency fumax.

Superhigh-frequency MMIC modules having coplanar or thin-film microstrip transmission lines according to the design principles of the present invention mentioned above will be explained.

[Embodiment 3.1]

Embodiment 3.1 provides an MMIC module with a coplanar waveguide transmission line based on the design principles mentioned above.

Figure 27A:
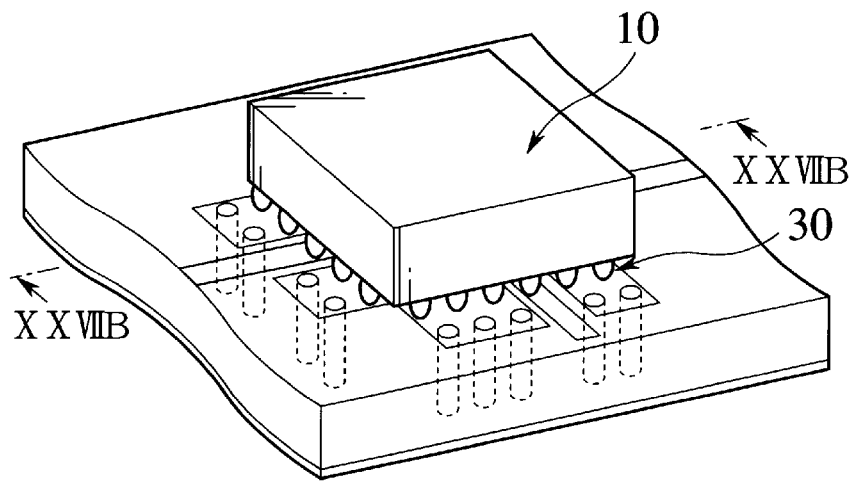
FIGS. 27A to 27C are a perspective view, sectional view, and circuit diagram showing an MMIC module according to embodiment 3.1 based on the third aspect.
Figure 27B:
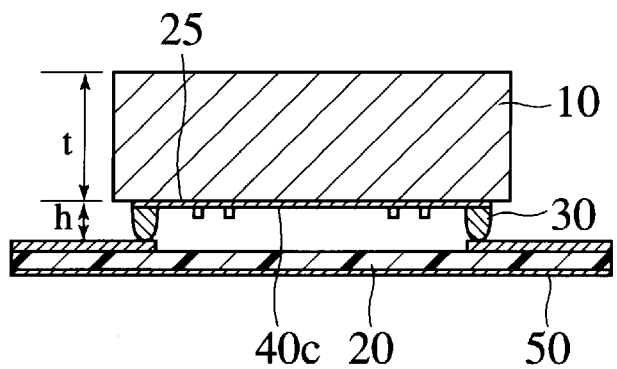
Figure 27C:
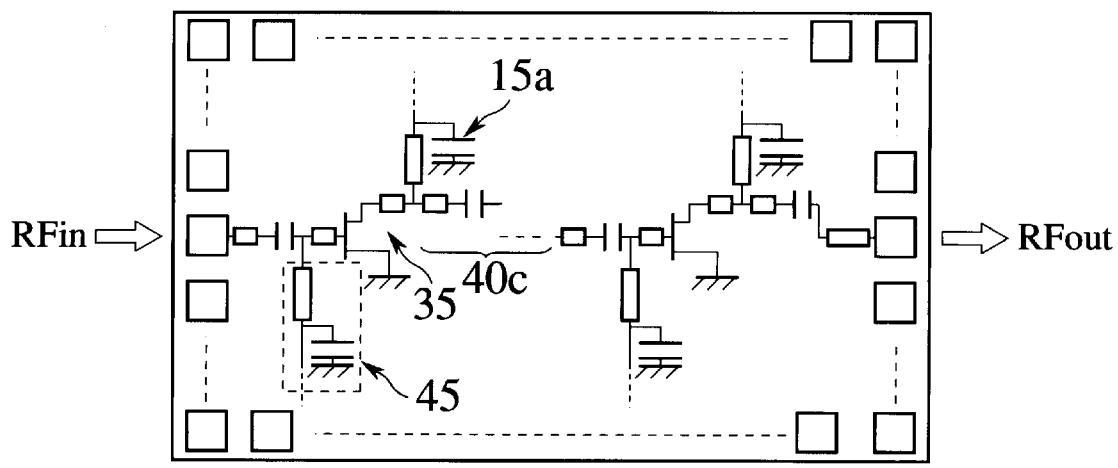

FIG. 27A is a perspective view showing the MMIC module of the embodiment 3.1 having an MMIC chip 10 flip-chip-mounted on a board 20, FIG. 27B is a sectional view taken along a line XXVIIB—XXVIIB of FIG. 27A, and FIG. 27C is a circuit diagram showing the MMIC module.

This MMIC module is designed to satisfy the following condition:

$$fumax < \frac{c}{4(t+h)\sqrt{\varepsilon r - 1}} = \frac{c}{13.8(t+h)} \quad (13)$$

where t ($\mu$m) is the thickness of a GaAs substrate of the MMIC chip 10, h ($\mu$m) is the height of bumps 30, and c is the velocity of light. The right side of this expression indicates the cutoff frequency fc of the TE1 mode of a parasitic transmission line of the coplanar waveguide transmission line of the MMIC module. As explained with reference to the simulation results of FIGS. 26A to 26C, the influence of an electromagnetic field leaking from the parasitic transmission line to air must be considered in the case of the coplanar waveguide transmission line. It is necessary to consider the GaAs substrate as well as the space formed by the bumps 30 between the GaAs substrate and the board 20 as a dielectric layer whose thickness is "t+h."

In this way, the embodiment 3.1 designs the maximum operation frequency fumax of the MMIC chip to be below the cutoff frequency fc of the GaAs substrate mode (parasitic transmission line), to secure proper isolation between input and output signals to and from the MMIC chip 10.

[Embodiment 3.2]

Embodiment 3.2 provides an MMIC module having a thin-film microstrip transmission line, based on the design principles of the present invention mentioned above.

Figure 28A:
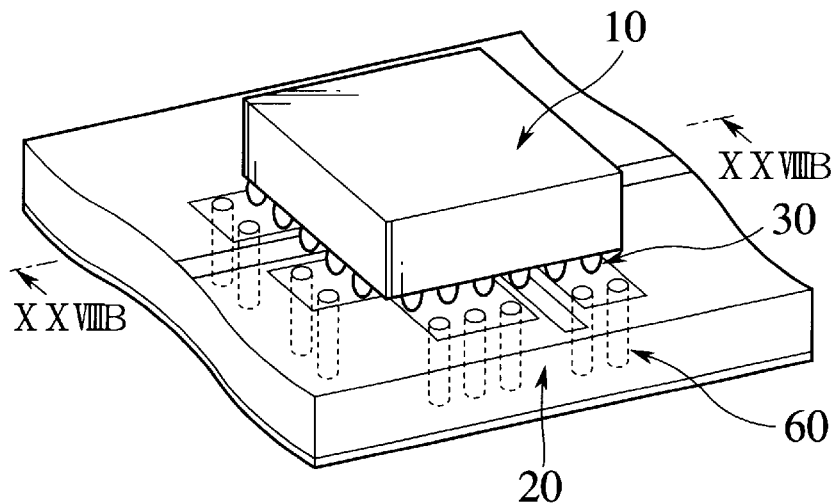
FIGS. 28A to 28C are a perspective view, sectional view, and circuit diagram showing an MMIC module according to embodiment 3.2 based on the third aspect.
Figure 28B:
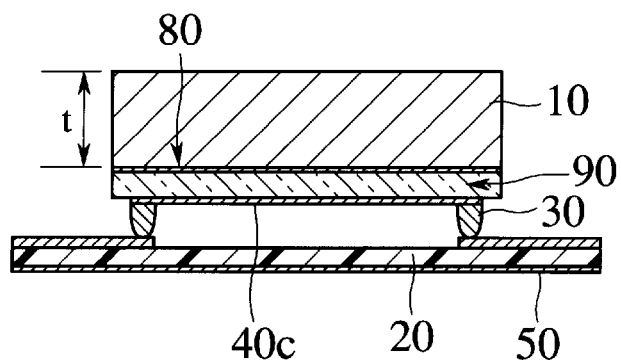
Figure 28C:
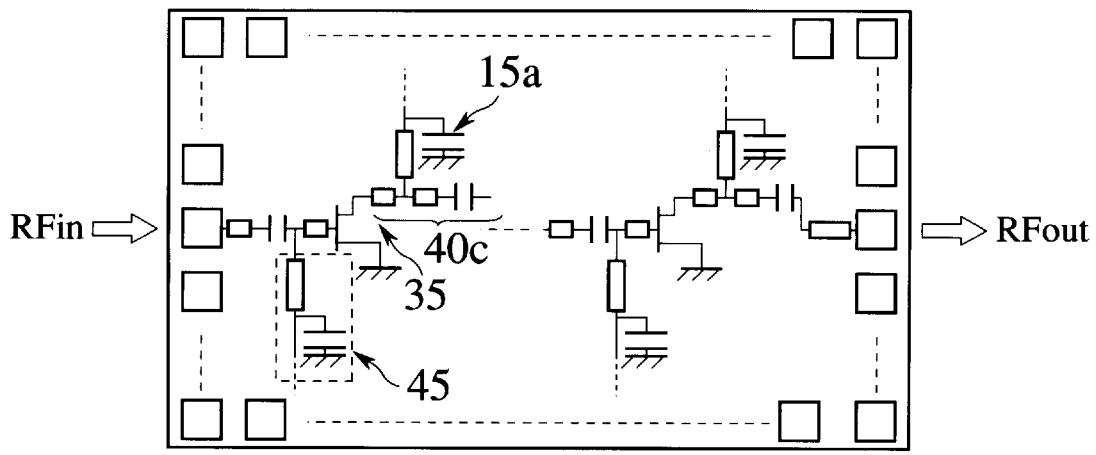

FIG. 28A is a perspective view showing the MMIC module of the embodiment 3.2 having an MMIC chip 10 flip-chip-mounted on a board 20, FIG. 28B is a sectional view taken along a line XXVIIIB—XXVIIIB of FIG. 28A, and FIG. 28C is a circuit diagram showing the MMIC module.

This MMIC module is designed to satisfy the following:

$$fumax < \frac{c}{4t\sqrt{\varepsilon r - 1}} = \frac{c}{13.8t} \quad (14)$$

where t ($\mu$m) is the thickness of a GaAs substrate of the MMIC chip 10 and c is the velocity of light. The right side of this expression indicates the cutoff frequency of the TE1 mode of a parasitic transmission line of the thin-film microstrip transmission line of the MMIC module.

In this way, the embodiment 3.2 designs the MMIC module to satisfy the expression (14) and secures proper isolation between input and output signals.

[Embodiment 3.3]

Embodiment 3.3 provides an MMIC module with a coplanar or thin-film microstrip transmission line, based on the design principles of the present invention mentioned above.

Figure 29A:
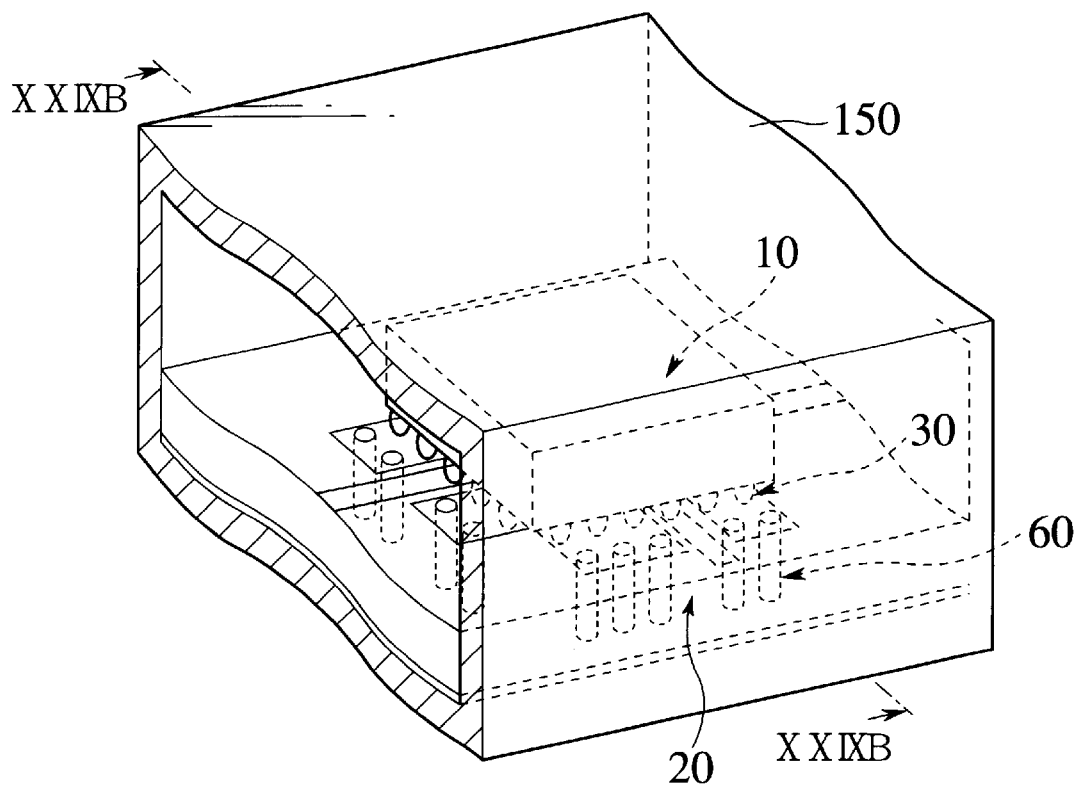
FIGS. 29A and 29B are perspective and sectional views showing an MMIC module according to embodiment 3.3 based on the third aspect.
Figure 29B:
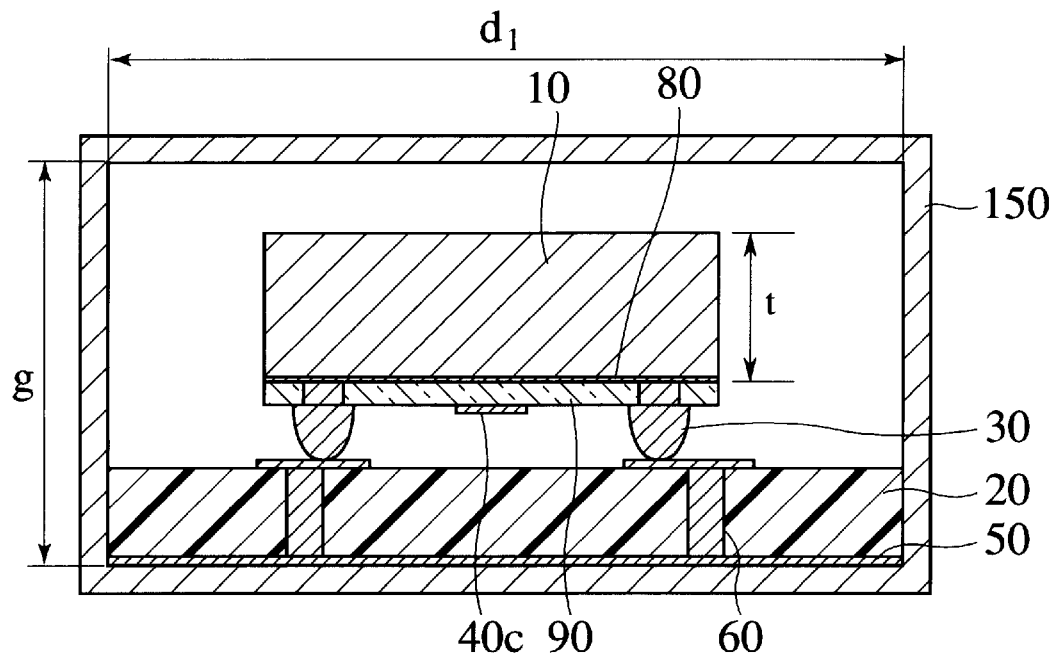

FIG. 29A is a perspective view showing the MMIC module of the embodiment 3.3, and FIG. 29B is a sectional view taken along a line XXIXB—XXIXB of FIG. 29A. Although this MMIC module employs a thin-film microstrip transmission line, it may employ a coplanar waveguide transmission line instead.

The MMIC module of the embodiment 3.3 may be any one of those of the embodiments 3.1 and 3.2 and is put in a rectangular metal pipe 150. Four faces of the pipe 150 are electrically connected to one another. A space in the pipe 150 corresponds to a waveguide, which blocks external signals of above a cutoff frequency.

The pipe 150 has a finite length, and therefore, isolation between the input and output of the pipe 150 deteriorates around the cutoff frequency. If the GaAs substrate mode of the MMIC module incorporated in the pipe 150 transmits an evanescent mode entering into the waveguide from the outside and couples it with a signal line of the MMIC module, isolation between the input and output of the MMIC module will deteriorate. In particular, if signals having greatly different levels are supplied to opposite ends of the pipe 150, for example, if signals from transmission and reception antennas are supplied to the MMIC module through the transmission line on the board 20, the problem of oscillation, etc., will occur.

The lowest-order propagation mode of the pipe 150 is the TE01 mode, and the cutoff frequency fc (GHz) of this transmission mode is expressed as follows:

$$fc = \frac{150}{d1} \tag{15}$$

where d1 is the inner width (mm) of the pipe 150.

The MMIC module in the pipe 150 may be any one of those of the embodiments 3.1 and 3.2, and therefore, satisfies the expression (13) or (14) with the substrate thickness "t" and bump height "h" being set properly. Accordingly, the parasitic transmission line shows only the transmission mode TM0.

The pipe 150, therefore, must be designed to have the cutoff frequency fc that blocks the lowest-order mode TM11 among TM modes passing through the pipe 150.

The cutoff frequency fc (GHz) of the TM11 mode is as follows:

$$fc = \frac{150}{d1}\sqrt{(1+(d1/g)^2)} \tag{16}$$

where d1 (mm) is the inner width of the pipe 150 and g (mm) is the inner height of the pipe 150. Consequently, the width d1 and height g of the pipe 150 must be designed to satisfy the following condition:

$$fumax < \frac{150}{d1}\sqrt{(1+(d1/g)^2)} \tag{17}$$

In this case, the pipe 150 transmits the TE mode. However, the inside of the MMIC module is shielded with the quasi-cavity so that the TE mode in the pipe 150 hardly couples with the transmission line and elements of the MMIC module, to thereby keep the operation of the MMIC chip stable.

If the expression (15) is satisfied, the pipe 150 does not transmit the lowest-order transmission mode TE01, to secure high input-output isolation comparable to that provided by conventional metal packages.

[Embodiment 3.4]

Embodiment 3.4 provides an MMIC module having a coplanar or thin-film microstrip transmission line, based on the design principles of the present invention.

Figure 30A:
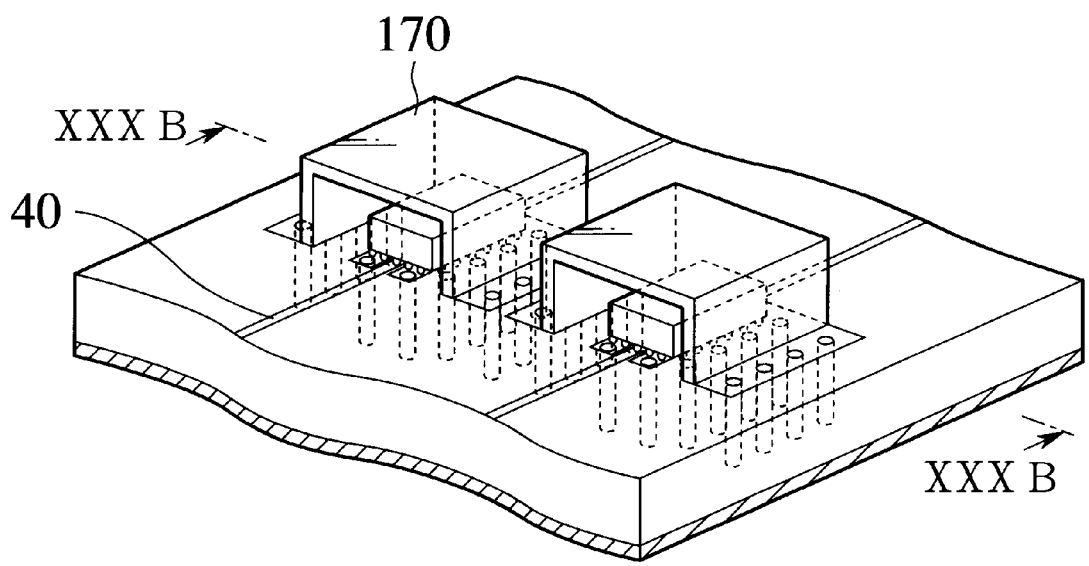
FIGS. 30A and 30B are perspective and sectional views showing an MMIC module according to embodiment 3.4 based on the third aspect.
Figure 30B:
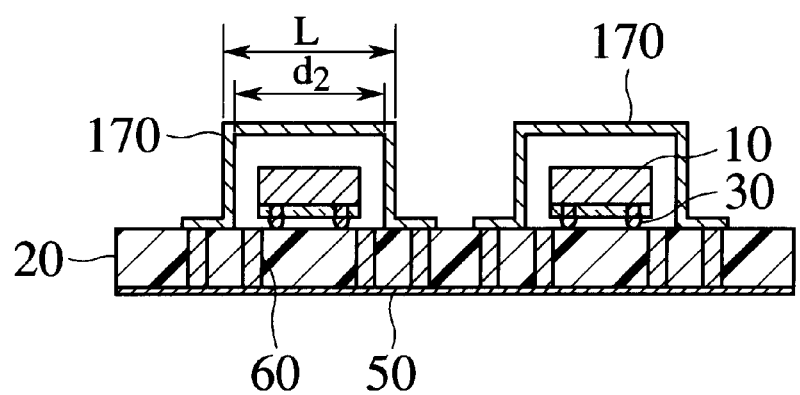

FIG. 30A is a perspective view showing the MMIC module of the embodiment 3.4, and FIG. 30B is a sectional view taken along a line XXXB—XXXB. Although each MMIC chip of FIG. 30B has a thin-film microstrip transmission line, it may have a coplanar waveguide transmission line instead.

The embodiment 3.4 is characterized by installing MMIC chips 10 each being any one of those of the embodiments 3.1 and 3.2 on a board 20 and covering each of the MMIC chips 10 with a metal cap 170.

Each side wall of the metal caps 170 is electrically connected to a ground electrode 50 formed on the back of the board 20 with through holes made through the board 20. Similar to the rectangular pipe 150 of the embodiment 3.3, the metal cap 170 blocks waves of above a cutoff frequency.

The cutoff frequency fc (GHz) of the metal cap 170 is expressed as follows:

$$fc = \frac{150}{d2} \tag{18}$$

where d2 (mm) is the inner width of the metal cap 170.

For a plurality of the MMIC chips arranged on the board 20, the metal caps 170 provide effective electric shields similar to a rectangular pipe that entirely accommodates an MMIC module, without increasing the size of each MMIC module.

Although the present invention has been explained according to the first to third aspects and their embodiments, the present invention is not limited to them. These aspects and embodiments are executable not only individually but also in various combinations.

For example, the MMIC module of FIG. 20C having the thin-film microstrip transmission line has the quasi-cavity defined with the ground line 80, bumps 30, through holes 60, and ground electrode 50. This quasi-cavity incorporates the MIM capacitors 15a that form short-circuit stubs. It is possible to design the maximum operation frequency fumax of the MMIC chip 10 of FIG. 20C to be higher than the resonance frequency fr of the quasi-cavity. Then, this MMIC module is a combination of the first and second aspects of the present invention. Further, the expression (14) may be applied to it, to realize a combination of the first to third aspects of the present invention.

Although the substrate of the MMIC chip of each embodiment is made of typical GaAs, the present invention is applicable to a substrate made of any dielectric material.

What is claimed is:

1. A semiconductor module for processing millimeter waves comprising:

an MMIC chip comprising a semiconductor device formed on a substrate, a transmission line formed on the substrate, the transmission line being connected to the semiconductor device and comprising a ground line, and a signal line;

first bumps formed along the periphery of the surface of the MMIC chip and electrically connected to the ground line;

a board on which the MMIC chip is flip-chip-mounted through the first bumps;

a ground electrode made of a third conductor film formed on the back of the board;

conductive through holes made through the board, to electrically connect the first bumps to the ground electrode;

the ground line, first bumps, through holes, and ground electrode forming a conductor continuum that defines a quasi-cavity, the resonance frequency (fr) of the quasi-cavity being higher than the maximum operation frequency of the MMIC chip, and the transmission line is one of a thin-film microstrip transmission line having an insulating layer disposed between the ground and signal lines, an inverted thin-film microstrip transmission line having an insulating layer disposed between the ground and signal lines, and a coplanar waveguide transmission.

2. The semiconductor module of claim 1, wherein the MMIC chip has one of square and rectangular shapes in plan view, and the maximum operation frequency (fumax) of the MMIC chip satisfies the following condition:

$$fumax < \frac{c}{2b\sqrt{ea}}$$

where "b" is the length of a second side of the plan shape adjacent to a first side of the plan shape serving as an input side for receiving external signals, "ea" is the equivalent dielectric constant of the quasi-cavity, and "c" is the velocity of light.

3. The semiconductor module of claim 1, wherein the MMIC chip has one of square and rectangular shapes in plan view, comprises more than 3 bumps in a second side of the plan shape adjacent to a first side of the plan shape serving as an input side for receiving external signals, and the maximum operation frequency (fumax) of the MMIC chip satisfies the following condition:

$$\frac{c}{2b\sqrt{ea}} < fumax < \frac{c}{2a\sqrt{ea}}$$

where "a" is the length of the first side of the plan shape, "b" is the length of the second side of the plan shape, "ea" is the equivalent dielectric constant of the quasi-cavity, and "c" is the velocity of light.

4. The semiconductor module of claim 1, wherein the ground electrode has an opening which is within the area of the MMIC chip projected onto the board, the opening is at least smaller than the planar area of the MMIC chip corresponding to the plan shape of the MMIC chip.

5. The semiconductor module of claim 5, wherein the diameter (0r) of the opening satisfies the following condition:

$$Or < \frac{\lambda u}{4\sqrt{\epsilon r}} < a;$$

where "λu" is a wavelength corresponding to the maximum operation frequency (fumax) of the MMIC chip, and "a" is the length of a first side of the square or rectangular plan shape of the MMIC chip serving as an input side for receiving external signals, and "εr" is the dielectric constant of the substrate.

6. The semiconductor module of claim 1, further comprising:
a rectangular conductive pipe for accommodating the MMIC chip and board and providing a cutoff frequency (fc1) that is higher than the maximum operation frequency (fumax) of the MMIC chip.

7. The semiconductor module of claim 1, further comprising:
a conductive box for accommodating the MMIC chip and board and providing a resonance frequency (fc2) that is higher than the maximum operation frequency (fumax) of the MMIC chip.

8. The semiconductor module of claim 1, further comprising:
vias formed in a central area of the MMIC chip and each consisting of a conductive through hole made in the MMIC chip, a second bump formed on the MMIC chip, and a conductive through hole made in the board, to electrically connect the ground line to the ground electrode.

9. The semiconductor module of claim 1, further comprising:
a resin seal disposed around the first bumps and around a space between the MMIC chip and the board.

10. The semiconductor module of claim 1, further comprising:
an air layer between the MMIC chip and the board.

11. The semiconductor module of claim 11, further comprising:
a resin seal disposed around the first bumps.

12. A semiconductor module comprising:
an MMIC chip comprising a substrate, a transmission line formed on the substrate, and at least one bias circuit, the transmission line being connected to the bias circuit and comprising a ground line and a signal line, the bias circuit having a MIM capacitor;
first bumps formed along the periphery of the surface of the MMIC chip and electrically connected to the ground line;
a board on which the MMIC chip is flip-chip-mounted through the first bumps;
a ground electrode made of a third conductor film formed on the back of the board;
conductive through holes made through the board, to electrically connect the first bumps to the ground electrode; and
a decoupling capacitor arranged nearby the MMIC chip;
the ground line, first bumps, through holes, and ground electrode forming a conductor continuum that defines a quasi-cavity,
the MIM capacitor being formed within the quasi-cavity, and
the transmission line is one of a thin-film microstrip transmission line having an insulating layer disposed between the ground and signal lines, an inverted thin film microstrip transmission line having an insulating layer disposed between the ground and signal lines, and a coplanar waveguide transmission line.

13. The semiconductor module of claim 12, wherein the MIM capacitors have a negative electrode that is common to the ground line.

14. The semiconductor module of claim 12, further comprising:
at least one via formed between each of the MIM capacitors and one of the first bumps nearest to the MIM capacitor, the via consisting of a through hole made through the MMIC chip, a third bump formed on the MMIC chip, and a through hole made through the board, to electrically connect the ground line to the ground electrode.

15. A semiconductor module comprising:
an MMIC chip comprising a semiconductor device disposed on a dielectric substrate, a main transmission line formed on the dielectric substrate, the main transmission line comprising a ground line, connected to said semiconductor device, made of a first conductor film and a signal line made of a second conductor film;
first bumps formed along the periphery of the surface of the MMIC chip and electrically connected to the ground line;
a board on which the MMIC chip is flip-chip-mounted through the first bumps;
a ground electrode made of a third conductor film formed on the back of the board;

conductive through holes made through the board, to electrically connect the first bumps to the ground electrode;

the substrate and ground line forming a parasitic transmission line, the cutoff frequency (fc) of a TE1 transmission mode of the parasitic transmission line being higher than the maximum operation frequency (fumax) of the MMIC chip.

16. The semiconductor module of claim 16, wherein:

the main transmission line is a coplanar waveguide transmission line;

bias circuits for active elements, having short-circuit stubs are formed on the dielectric substrate; and the following condition is satisfied:

$$fumax < \frac{c}{4(t+h)\sqrt{\varepsilon r - 1}}$$

where "fumax" is the maximum operation frequency of the MMIC chip, "$\varepsilon r$" is the dielectric constant of the dielectric substrate, "t" is the thickness of the dielectric substrate, "h" is the height of the first bumps, and "c" is the velocity of light.

17. The semiconductor module of claim 15, wherein:

the main transmission line is a thin-film microstrip transmission line;

bias circuits for active elements, having short-circuit stubs are formed on the dielectric substrate; and the following condition is satisfied:

$$fumax < \frac{c}{4t\sqrt{\varepsilon r - 1}}$$

where "fumax" is the maximum operation frequency of the MMIC chip, "$\varepsilon r$" is the dielectric constant of the dielectric substrate, "t" is the thickness of the dielectric substrate, and "c" is the velocity of light.

18. The semiconductor module of claim 16, wherein the dielectric substrate is a GaAs substrate.

19. The semiconductor module of claim 1, wherein the through hole made through the board is formed inside an area which the MMIC chip faces.

20. The semiconductor module of claim 3, wherein MMIC chip has a dielectric layer and the following condition is satisfied:

$$\frac{h1 + h2 + h3}{ea} = \frac{h1}{e1} + \frac{h2}{e2} + \frac{h3}{e3}$$

where "ea" is the equivalent dielectric constant of the quasi-cavity, "h1" is the thickness of the dielectric layer, "h2" is the thickness of the space between the MMIC chip and the board, "h3" is the thickness of the board, "e1" is the dielectric constant of the dielectric layer, "e2" is the dielectric constant of the space, "e3" is the dielectric constant of the board.

21. The semiconductor module of claim 12, wherein the MIM capacitor is used for processing millimeter waves.

22. The semiconductor module of claim 16, wherein the semiconductor module is used for processing millimeter waves.

23. The semiconductor module of claim 15, further comprising:

a ground electrode made of a third conductor film formed on the back of the board; and conductive through holes made through the board, to electrically connect the first bumps to the ground electrode.

24. The semiconductor module of claim 23, wherein:

the ground lines, first bumps, through holes, and the ground electrode form a conductor continuum that defines a quasi-cavity, and the resonance frequency of the quasi-cavity is higher than a maximum operation frequency of the MMIC chip.

* * * * *

UNITED STATES PATENT AND TRADEMARK OFFICE
CERTIFICATE OF CORRECTION

PATENT NO. : 6,130,483

DATED : October 10, 2000

INVENTOR(S): Yasushi SHIZUKI, et al.

It is certified that an error appears in the above-identified patent and that said Letters Patent is hereby corrected as shown below:

On the Title Page, the CPA information has been omitted. It should read as follows:

--[45] **Date of Patent: \*Oct. 10, 2000** --

--[ \* ] Notice: This patent issued on a continued prosecution application filed under 37 CFR 1.53(d), and is subject to the twenty year patent term provisions of 35 U.S.C. 154(a)(2). --

Signed and Sealed this

First Day of May, 2001

*Attest:*

NICHOLAS P. GODICI

*Attesting Officer*   Acting Director of the United States Patent and Trademark Office